(12) United States Patent
Nakamura et al.

(10) Patent No.: US 7,977,253 B2
(45) Date of Patent: Jul. 12, 2011

(54) MANUFACTURING METHOD OF SEMICONDUCTOR DEVICE

(75) Inventors: Osamu Nakamura, Atsugi (JP); Hiroko Yamamoto, Hadano (JP); Junko Sato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 171 days.

(21) Appl. No.: 11/206,788

(22) Filed: Aug. 19, 2005

(65) Prior Publication Data

US 2006/0046512 A1  Mar. 2, 2006

(30) Foreign Application Priority Data

Aug. 31, 2004  (JP) ................... 2004-252497

(51) Int. Cl.
*H01L 21/31* (2006.01)
*H01L 21/469* (2006.01)
(52) U.S. Cl. .................. 438/770; 257/E21.413
(58) Field of Classification Search .................. 438/770; 257/E21.413
See application file for complete search history.

(56) References Cited

U.S. PATENT DOCUMENTS

| | | | |
|---|---|---|---|
| 4,595,601 A * | 6/1986 | Horioka et al. ............... 438/695 |
| 4,612,085 A * | 9/1986 | Jelks et al. ..................... 438/694 |
| 4,690,729 A | 9/1987 | Douglas |
| 4,769,750 A * | 9/1988 | Matsumoto et al. .......... 362/268 |
| 4,810,601 A * | 3/1989 | Allen et al. ..................... 430/18 |
| 5,343,271 A * | 8/1994 | Morishige ....................... 355/53 |
| 5,700,703 A * | 12/1997 | Huang et al. .................. 438/186 |
| 5,877,071 A * | 3/1999 | Shiralagi et al. .............. 438/492 |
| 6,027,960 A * | 2/2000 | Kusumoto et al. ............ 438/166 |
| 6,285,055 B1 * | 9/2001 | Gosain et al. .................. 257/317 |
| 6,326,221 B1 | 12/2001 | Lee et al. |
| 6,378,995 B1 * | 4/2002 | Yun et al. ........................ 347/70 |
| 6,416,583 B1 | 7/2002 | Kitano et al. |

(Continued)

FOREIGN PATENT DOCUMENTS

JP  60-249312  12/1985

(Continued)

OTHER PUBLICATIONS

Mullenborn et al., Laser direct writing of oxide structures on hydrogen-passivated silicon surfaces, Appl. Phys. Lett. 69 (20), Nov. 11, 1996, pp. 3013-3015.*

(Continued)

*Primary Examiner* — Kiesha R Bryant
*Assistant Examiner* — Igwe U Anya
(74) *Attorney, Agent, or Firm* — Eric J. Robinson; Robinson Intellectual Property Law Office, P.C.

(57) ABSTRACT

A method for forming a semiconductor layer having a fine shape is provided. A method for manufacturing a semiconductor device with few variations is provided. In addition, a method for manufacturing a semiconductor device with a high yield is provided where the cost can be reduced with few materials. According to the invention, a semiconductor film is partially irradiated with a laser beam to form an insulating layer, and the semiconductor film is etched using the insulating film as a mask so as to form a semiconductor layer having a desired shape. Then, the semiconductor layer is used to manufacture a semiconductor device. According to the invention, a semiconductor layer having a fine shape can be formed in a predetermined position without using a known photolithography step using a resist.

36 Claims, 26 Drawing Sheets

U.S. PATENT DOCUMENTS

| | | | |
|---|---|---|---|
| 6,475,700 B1* | 11/2002 | Higashi et al. | 430/278.1 |
| 6,541,315 B2* | 4/2003 | Yamazaki et al. | 438/151 |
| 6,551,867 B1 | 4/2003 | Ozeki et al. | |
| 6,627,263 B2 | 9/2003 | Kitano et al. | |
| 6,764,967 B2 | 7/2004 | Pai et al. | |
| 6,830,856 B2 | 12/2004 | Tsai et al. | |
| 6,833,327 B2 | 12/2004 | Ishikawa | |
| 6,847,084 B2 | 1/2005 | Ono et al. | |
| 6,849,825 B2* | 2/2005 | Tanaka | 219/121.82 |
| 7,247,529 B2 | 7/2007 | Shoji et al. | |
| 7,704,861 B2* | 4/2010 | Kaneko et al. | 438/487 |
| 2002/0136829 A1 | 9/2002 | Kitano et al. | |
| 2002/0187594 A1* | 12/2002 | Yamazaki et al. | 438/166 |
| 2003/0003619 A1* | 1/2003 | Winer et al. | 438/50 |
| 2004/0183931 A1* | 9/2004 | Yamazaki et al. | 348/294 |
| 2004/0222197 A1* | 11/2004 | Hiramatsu | 219/121.7 |
| 2004/0222429 A1* | 11/2004 | Yamazaki et al. | 257/79 |
| 2004/0224446 A1* | 11/2004 | Yeh | 438/166 |
| 2004/0241923 A1* | 12/2004 | Toida | 438/166 |
| 2005/0196711 A1 | 9/2005 | Shiroguchi et al. | |
| 2005/0211680 A1* | 9/2005 | Li et al. | 219/121.68 |
| 2005/0226287 A1* | 10/2005 | Shah et al. | 372/25 |
| 2005/0276912 A1 | 12/2005 | Yamamoto et al. | |
| 2006/0038174 A1 | 2/2006 | Maekawa | |
| 2006/0046476 A1 | 3/2006 | Nakamura et al. | |
| 2006/0211187 A1* | 9/2006 | Choi et al. | 438/197 |
| 2007/0070319 A1 | 3/2007 | Nakamura et al. | |
| 2010/0143828 A1* | 6/2010 | Sano et al. | 430/5 |

FOREIGN PATENT DOCUMENTS

| | | |
|---|---|---|
| JP | 63-051641 | 3/1988 |
| JP | 06244184 A * | 9/1994 |
| JP | 08-288518 | 11/1996 |
| JP | 2000-188251 | 7/2000 |
| JP | 2004-356637 | 12/2004 |

OTHER PUBLICATIONS

Mullenborn et al. Laser Direct Writting of Oxide structures on Hydrogen Passivated Silicon Surfaces, Appl. Phy. Lett. 69 (20), Nov. 11, 1996.*

"Office Action (Application No. 200510103678.3; CN8134) Dated Mar. 28, 2008,".

Office Action (Application No. 200510103676.4) dated May 30, 2008.

* cited by examiner

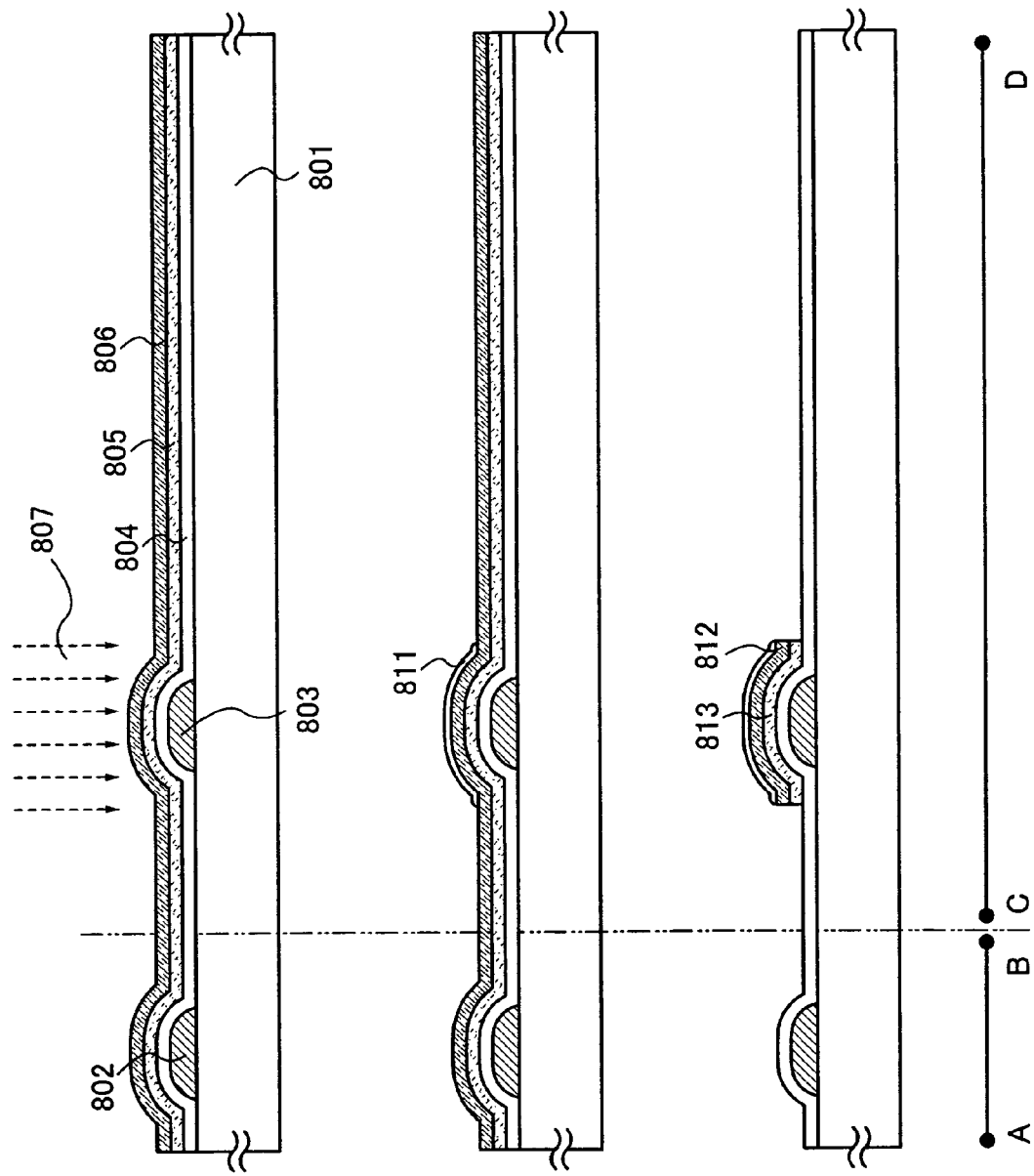

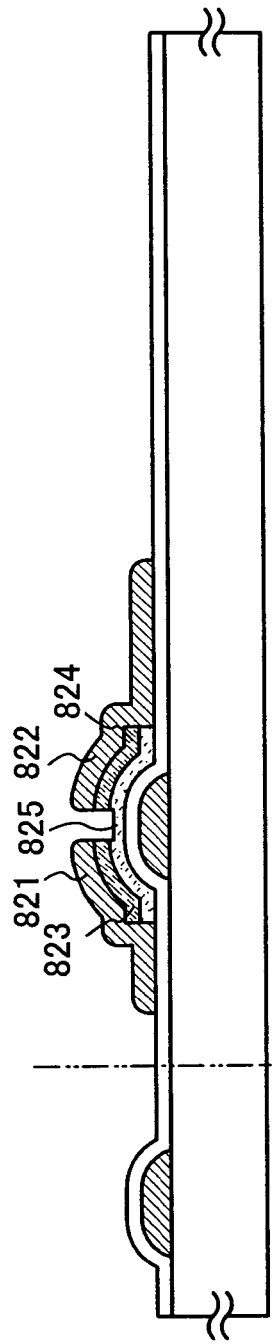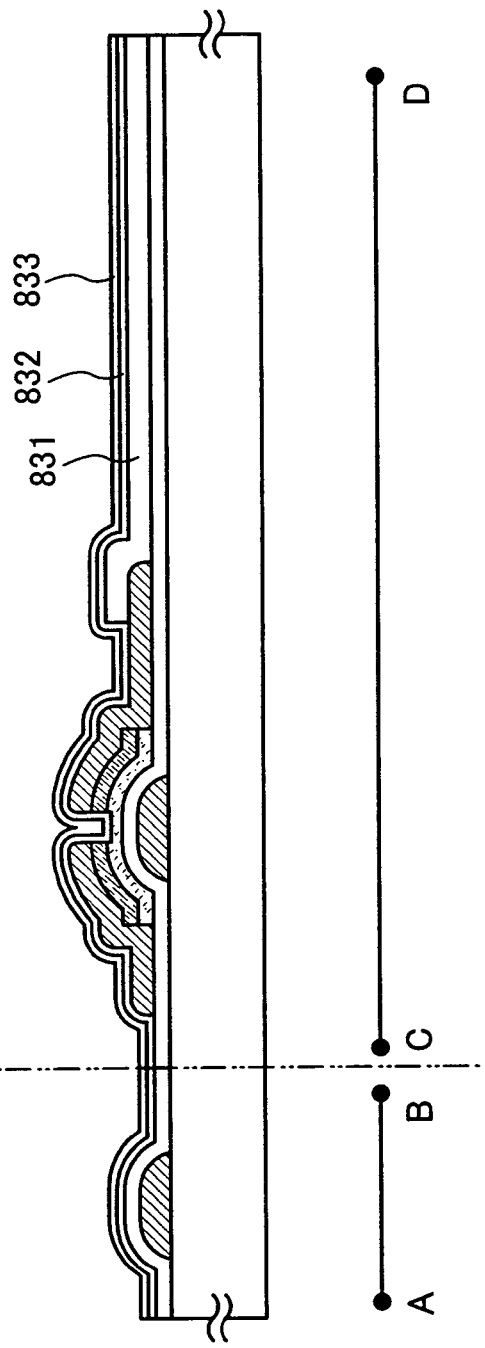
FIG. 9A
FIG. 9B

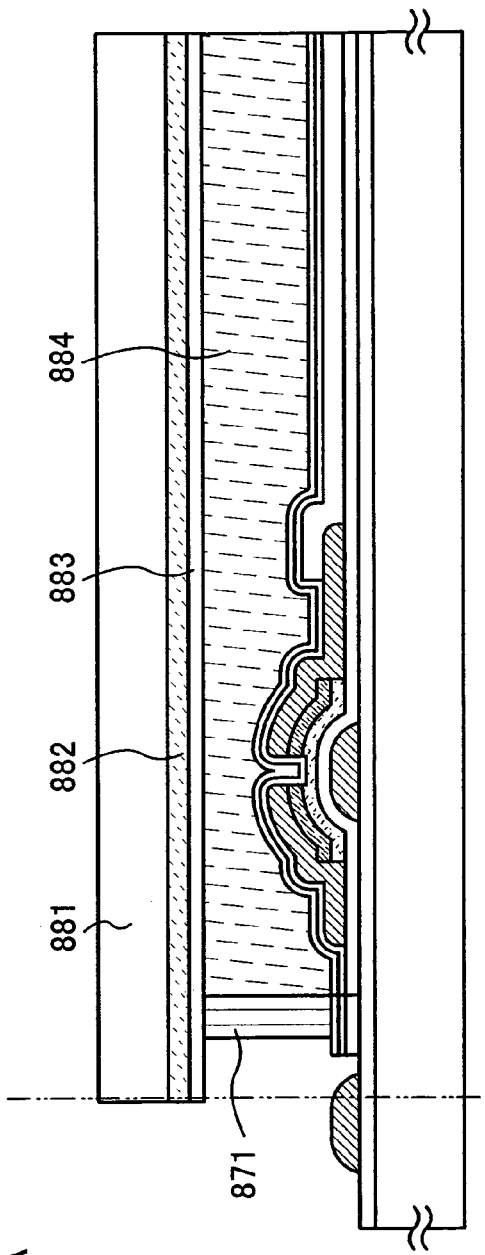
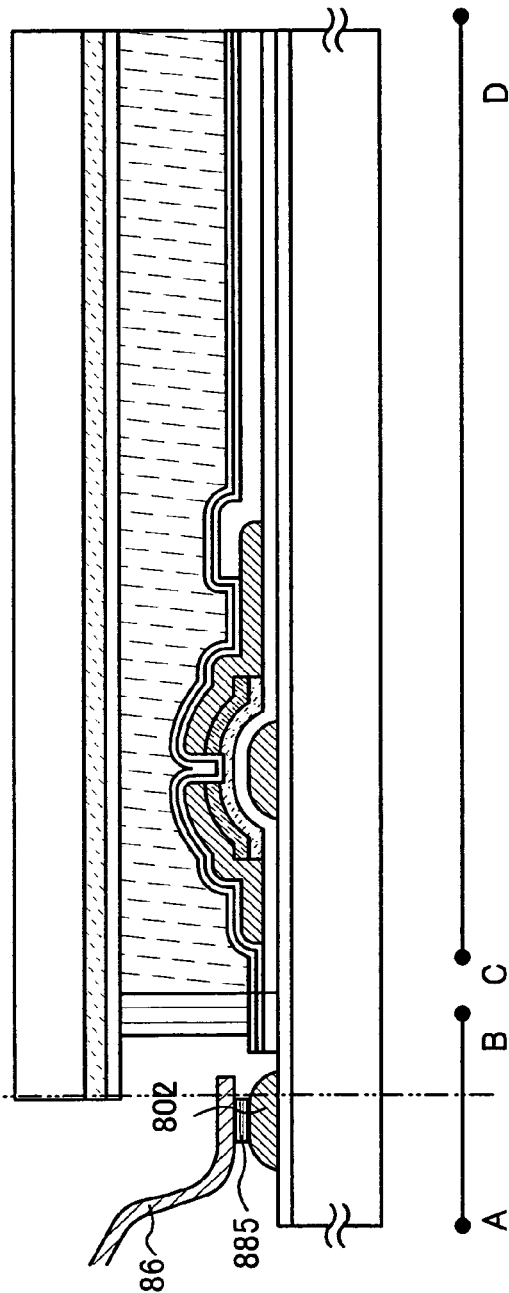
FIG. 10A
FIG. 10B

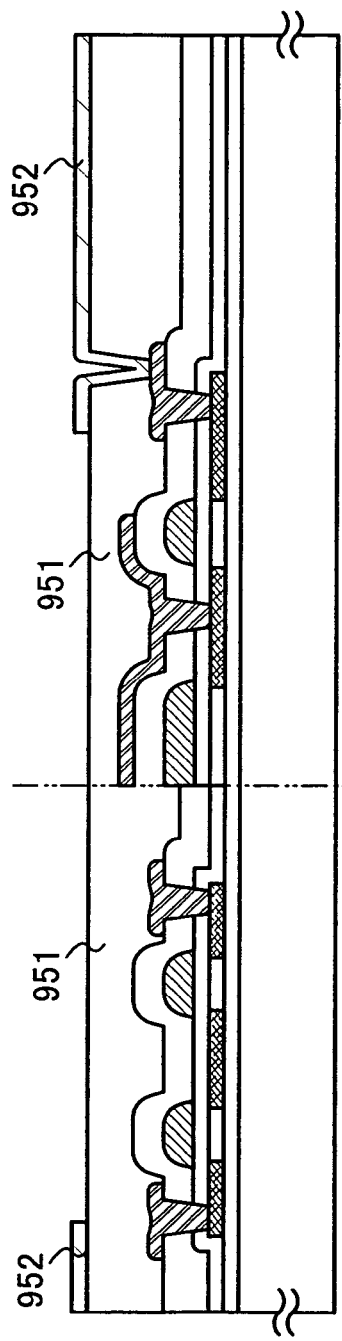
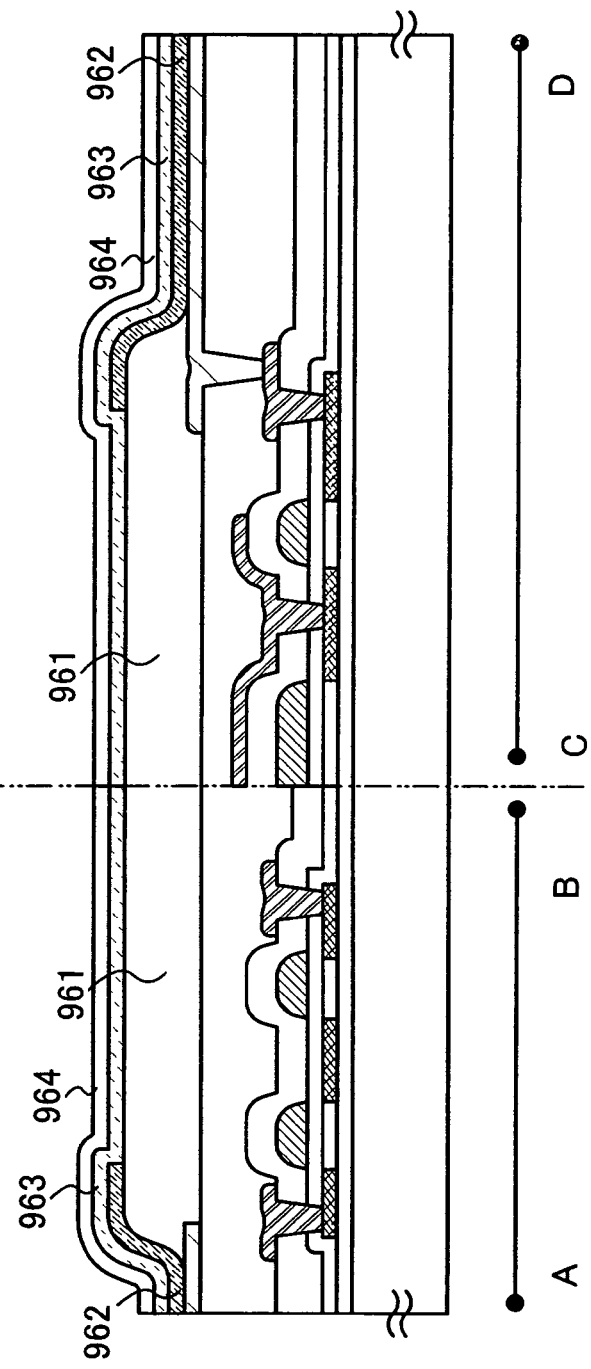
FIG. 14A
FIG. 14B

MANUFACTURING METHOD OF SEMICONDUCTOR DEVICE

BACKGROUND OF THE INVENTION

1. Field of the Invention

The present invention relates to a method for manufacturing a semiconductor device having a semiconductor element.

2. Description of the Related Art

Conventionally, a so-called active matrix driving type display panel or a semiconductor integrated circuit which has a semiconductor element typified by a thin film transistor (hereinafter also referred to as a "TFT") or an MOS transistor is manufactured by patterning various thin films through a light-exposure step using a photomask (hereinafter referred to as a photolithography step).

In a photolithography step, a resist mask is formed by applying a resist to the entire surface of a substrate, prebaking it, irradiating the resist with an ultraviolet ray or the like through a photomask, and then developing it. After that, a thin film (thin film formed of a semiconductor material, an insulating material or a conductive material) which is present except in a portion to be a semiconductor layer or a wiring is etched to be removed using the resist mask, thereby the semiconductor layer or the wiring is formed.

In addition, in order to reduce the waste of materials used for depositing a film, there is a technique for depositing a film over a semiconductor wafer using a system capable of continuously discharging a resist from a nozzle so as to form a linear pattern with a narrow width (see Japanese Patent Application Laid-Open No. 2000-188251).

SUMMARY OF THE INVENTION

However, when forming a semiconductor layer with a desired shape by etching a semiconductor film using the conventional photolithography step, a resist is applied to the surface of the semiconductor film. At this time, there is a problem in that the surface of the semiconductor film is directly exposed to the resist, and thus is contaminated by impurities such as oxygen, carbon, heavy-metal elements and the like contained in the resist. Due to the contamination, impurity elements are mixed into the semiconductor film, which would degrade the characteristics of the semiconductor element. In particular, as for TFT, there is a problem in that this contamination causes variations and degradation of the transistor characteristics.

In addition, in a process of forming a wiring or a semiconductor layer using the photolithography step, there is a problem in that the throughput is decreased due to a number of steps required for forming the wiring or the semiconductor layer while the most of the materials for the resist, the wiring or the semiconductor film result in waste.

Further, a light-exposure system used for the photolithography step has a difficulty in performing light exposure to a large-area substrate at a time. Therefore, in a manufacturing method of a semiconductor device using a large-area substrate, a plurality of light-exposure steps are required, which will produce misalignment with an adjacent pattern, resulting in a lower yield.

Further, in order to form a fine semiconductor element which occupies a small area by a droplet discharge method, an aqueous material is required to be discharged with a small drop size. In this case, it is only required that the diameter of a nozzle be small; however, a composition of the aqueous material adheres to the head of the nozzle, and then dried and solidified, which causes clogging and the like. Thus, it is difficult to discharge a fixed amount of an aqueous material continuously and stably. As a result, such a problem is posed that the throughput and the yield of a semiconductor device having such a semiconductor element are decreased.

The invention is made in view of the foregoing problems. It is an object of the invention to provide a method for forming a semiconductor element having a semiconductor layer (semiconductor island) with a fine structure without using a resist. It is another object of the invention to provide a method for manufacturing a semiconductor device where the cost can be reduced with a small number of steps. It is still another object of the invention to provide a method for manufacturing a semiconductor device where the cost can be reduced by reducing materials. It is yet another object of the invention to provide a method for manufacturing a semiconductor device where the throughput can be improved and mass productivity is high. It is yet another object of the invention to provide a method for manufacturing a semiconductor device with few variations.

According one aspect of the invention, a semiconductor film is partially irradiated with a laser beam to form an insulating layer. Then, the semiconductor film is etched using the insulating layer as a mask, thereby forming a semiconductor layer having a desired shape.

According to another aspect of the invention, a semiconductor element having the aforementioned semiconductor layer with the desired shape is formed, and a semiconductor device having such a semiconductor element is formed.

The insulating layer formed over the semiconductor film is a silicon oxide film obtained by oxidizing the surface of the semiconductor film. The insulating layer and the semiconductor film can have etching selectivity in an etching step. As a result, the semiconductor film can be selectively etched using the insulating layer as a mask.

As an etching method of the semiconductor film, dry etching or wet etching may be employed. The dry etching may be performed by using a chlorine source gas typified by $Cl_2$, $BCl_3$, $SiCl_4$, $CCl_4$ or the like, a fluorine source gas typified by $CF_4$, $SF_6$, $NF_3$, $CHF_3$, $ClF_3$ or the like, or $O_2$. Meanwhile, the wet etching may be performed by using an alkaline solution such as an aqueous solution containing hydrazine or tetramethyl ammonium hydroxide (TMAH, chemical formula: $(CH_3)_4NOH$).

In addition, by controlling the width of a laser beam spot, a semiconductor layer with an arbitrary width can be formed. Therefore, by irradiating the semiconductor film with a laser beam with a narrow beam spot width using a laser beam direct writing system, a semiconductor layer with a fine shape and narrow width (typically, a width of 20 μm or less, or more preferably 0.5 to 15 μm) can be formed. A semiconductor element having such a semiconductor layer occupies a small area. Therefore, a highly integrated semiconductor device can be manufactured.

According to one aspect of the invention, a semiconductor device including a semiconductor element which has the semiconductor layer as an active layer is provided. The semiconductor element includes a TFT, a memory element, a diode, a photoelectric conversion element, a capacitor, a resistor or the like. In addition, the TFT includes a staggered TFT, an inversely staggered TFT (channel-etched TFT or channel-protected TFT), and a coplanar TFT of a bottom-gate structure or a top-gate structure.

In the invention, the semiconductor device includes an integrated circuit, a display device, a wireless tag, an IC tag and the like, each including a semiconductor element. As a typical display device, there are a liquid crystal display device, a light-emitting display device, a DMD (Digital Micromirror Device), a PDP (Plasma Display Panel), an FED (Field Emission Display), an electrophoretic display device (electronic paper) and the like.

In the invention, the display device means a device using a display element, namely an image display device. The display device includes in its category a module in which a connector such as an FPC (Flexible Printed Circuit), a TAB (Tape Automated Bonding) tape or a TCP (Tape Carrier Package) is attached to a display panel; a module having a printed wiring board on a tip of a TAB tape or a TCP; and a module in which an IC (Integrated Circuit) or a CPU is directly mounted on the display element by COG (Chip on Glass) bonding.

In the invention, a semiconductor film is partially irradiated with a laser beam to form an insulating layer in an arbitrary region, and then the semiconductor film can be etched using the insulating layer as a mask. Therefore, even without using a known photolithography step using a resist, a semiconductor layer having a desired shape can be formed in a predetermined position.

In addition, by controlling the diameter of a laser beam spot to be small, an irradiation area of the laser beam can be reduced. In particular, the use of a laser beam direct writing system makes it possible to irradiate a predetermined position with a laser beam having a minute beam spot. Therefore, an insulating layer having a fine shape can be formed. By using the insulating layer having a fine shape as a mask, a semiconductor layer having a fine shape can be formed.

Thus, a semiconductor element with a fine shape can be formed while preventing impurity elements from being mixed into the semiconductor film due to the application of a resist, thereby a highly integrated semiconductor device with few variations can be manufactured. In addition, a semiconductor layer having a desired shape can be formed without the need for a photolithography step using a resist. Thus, only a small number of steps is required and a reduction of materials can be achieved. As a result, cost reduction can be achieved.

When a semiconductor layer, a wiring or the like is formed by using a droplet discharge method, droplets can be discharged at a predetermined position by changing the position of a nozzle, which is a discharge head of a droplet containing a material of such films, relatively to the position of the substrate. In addition, depending on the nozzle size, the discharge amount of droplets, and the relative relationship between the movement speed of the nozzle and the substrate on which discharged droplets are formed, the thickness or width of a film pattern can be controlled. Therefore, even over a large-area substrate having a side of over 1 to 2 m, a film pattern can be formed with accuracy at a desired position. In addition, since misalignment with an adjacent film pattern is not caused, the yield can be improved. As a result, a semiconductor device can be manufactured with a small number of steps and with a high yield.

Further, a liquid crystal television set and an EL television set each having a semiconductor device formed in accordance with the aforementioned manufacturing steps, can be manufactured at low cost.

BRIEF DESCRIPTION OF THE DRAWINGS

In the accompanying drawings:

FIGS. 8A to 8C are cross-sectional views illustrating manufacturing steps of a semiconductor device in accordance with the invention;

FIGS. 9A and 9B are cross-sectional views illustrating manufacturing steps of a semiconductor device in accordance with the invention;

FIGS. 10A and 10B are cross-sectional views illustrating manufacturing steps of a semiconductor device in accordance with the invention;

FIGS. 14A and 14B are cross-sectional views illustrating manufacturing steps of a semiconductor device in accordance with the invention;

DETAILED DESCRIPTION OF THE INVENTION

Figure 1A:
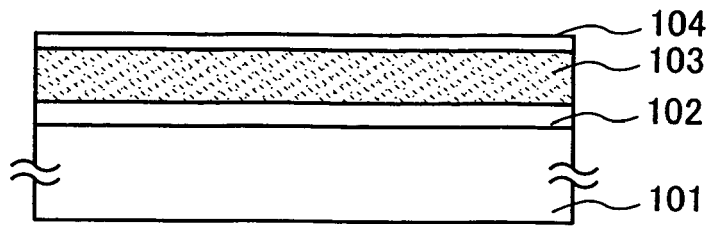
FIGS. 1A to 1E are cross-sectional views illustrating manufacturing steps of a semiconductor layer in accordance with the invention.

Although the invention will be fully described by way of embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein. In addition, common portions are denoted by common reference numerals in all the drawings, and detailed description thereon is omitted.

Embodiment Mode 1

In this embodiment mode, description is made with reference to FIGS. 1A to 1E and FIG. 22 on steps for forming a semiconductor layer (semiconductor island) having a desired shape by irradiation of a laser beam (hereinafter also referred to as laser light).

As shown in FIG. 1A, a first insulating layer 102 is formed over a substrate 101, and a semiconductor film 103 is formed over the first insulating layer 102. When a surface of the semiconductor film 103 is exposed to oxygen, and thus is oxidized to form a second insulating layer 104 which may be a natural oxide layer.

As the substrate 101, a glass substrate, a quartz substrate, a substrate formed of a ceramic insulating material such as alumina, a plastic substrate, a silicon wafer, a metal plate or the like can be used. In the case of using a glass substrate as the substrate 101, a glass substrate having a large area can be employed, e.g., 320 mm×400 mm, 370 mm×470 mm, 550 mm×650 mm, 600 mm×720 mm, 680 mm×880 mm, 1000 mm×1200 mm, 1100 mm×1250 mm or 1150 mm×1300 mm.

As a typical example of the plastic substrate, there are a plastic substrate formed of PET (polyethylene terephthalate), PEN (polyethylene naphthalate), PES (polyether sulfone), polypropylene, polypropylene sulfide, polycarbonate, polyetherimide, polyphenylene sulfide, polyphenylene oxide, polysulfone or polyphthalamide, a substrate formed of an organic material dispersed with inorganic particles having a diameter of several nanometers, and the like. In addition, the surface of the substrate is not required to be flat, and thus may have projections and depressions or a curved surface.

The first insulating layer 102 is formed to have a single-layer structure or a stacked-layer structure of silicon nitride, silicon oxide, and an insulating film containing other silicon by using a thin-film formation method such as plasma CVD or sputtering. In addition, in view of a blocking effect of impurities from the substrate and the interfacial properties between the first insulating film 102 and a semiconductor layer, the first insulating layer 102 preferably has a stacked-layer structure in which a silicon nitride film (silicon nitride oxide film), a silicon oxide film and a silicon nitride film (silicon nitride oxide film) are stacked from a side which is in contact with the substrate.

The semiconductor film 103 is formed by using a film having any state selected from an amorphous semiconductor, a semi-amorphous semiconductor in which an amorphous state and a crystalline state are mixed (also referred to as an SAS), and a microcrystalline semiconductor in which crystal grains of 0.5 to 20 nm can be observed in an amorphous semiconductor. Specifically, the microcrystalline state in which crystal grains of 0.5 to 20 nm can be observed is referred to as microcrystal (μc).

The semiconductor film 103 can be formed to contain silicon, silicon germanium (SiGe) or the like as a main component. In addition, acceptor elements or donor elements such as phosphorus, arsenic and boron may be contained therein. The semiconductor film 103 has a thickness of 10 to 150 nm, or preferably 30 to 70 nm.

The second insulating layer 104 is a silicon oxide film which is formed by exposing the surface of the semiconductor film 103 to oxygen in the atmospheric air to be oxidized. Therefore, the second insulting layer 104 is thin, and typically has a thickness of 5 to 15 nm, or preferably 10 nm.

Figure 1B:
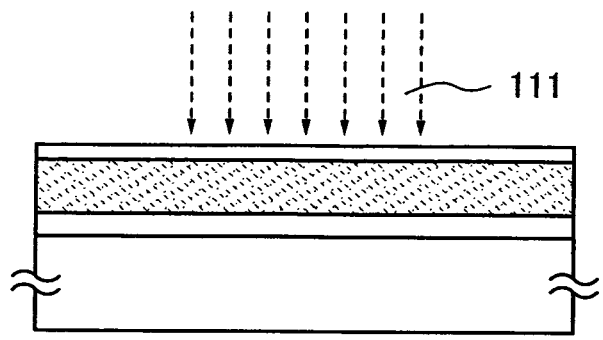
Figure 1C:
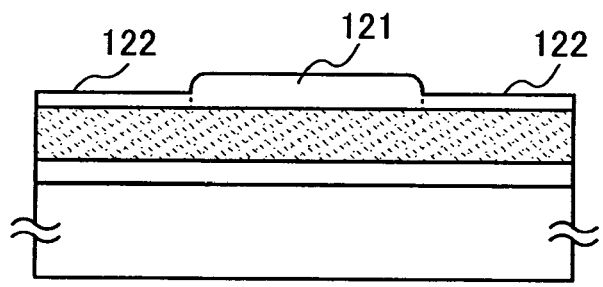

Subsequently, as shown in FIG. 1B, the semiconductor film 103 is irradiated with a laser beam 111 to partially form a third insulating layer 121 as shown in FIG. 1C. Here, the second insulating layer 104 is irradiated with the laser beam 111 using a laser beam direct writing system. At this time, a region of the second insulating layer 104 and the semiconductor film 103, which is irradiated with the laser beam, is oxidized by the energy of the laser beam, thereby the third insulating layer 121 is formed. Note that the third insulating layer 121 corresponds to partially thick region of the second insulating layer 104.

A region which is not irradiated with the laser beam 111 remains as the second insulating layer 104. The second insulating layer 104 which is exposed on the periphery of the third insulating layer 121 is referred to as a fourth insulating layer 122. Laser irradiation is performed in an oxygen atmosphere or an air atmosphere.

The third insulating layer 121 is formed of an oxide layer, typically a semiconductor oxide layer. The third insulating layer 121 is preferably twice or more thicker than the second insulating layer 104. In addition, the third insulating layer 121 is preferably a dense insulating layer, and the etching rate thereof is preferably smaller, and typically half or less of that of the second insulating layer 104.

Note that the hydrogen concentration of the semiconductor film 103 is preferably reduced before the second insulating layer 104 is irradiated with a laser beam. Typically, the semiconductor film is formed while reducing the hydrogen concentration. Alternatively, the semiconductor film 103 may be heated to be dehydrogenated. By reducing the hydrogen concentration or carrying out dehydrogenation, it becomes possible to decrease the hydrogen desorption which occurs when the semiconductor film is irradiated with a laser beam, and the surface roughness caused thereby.

Figure 22:
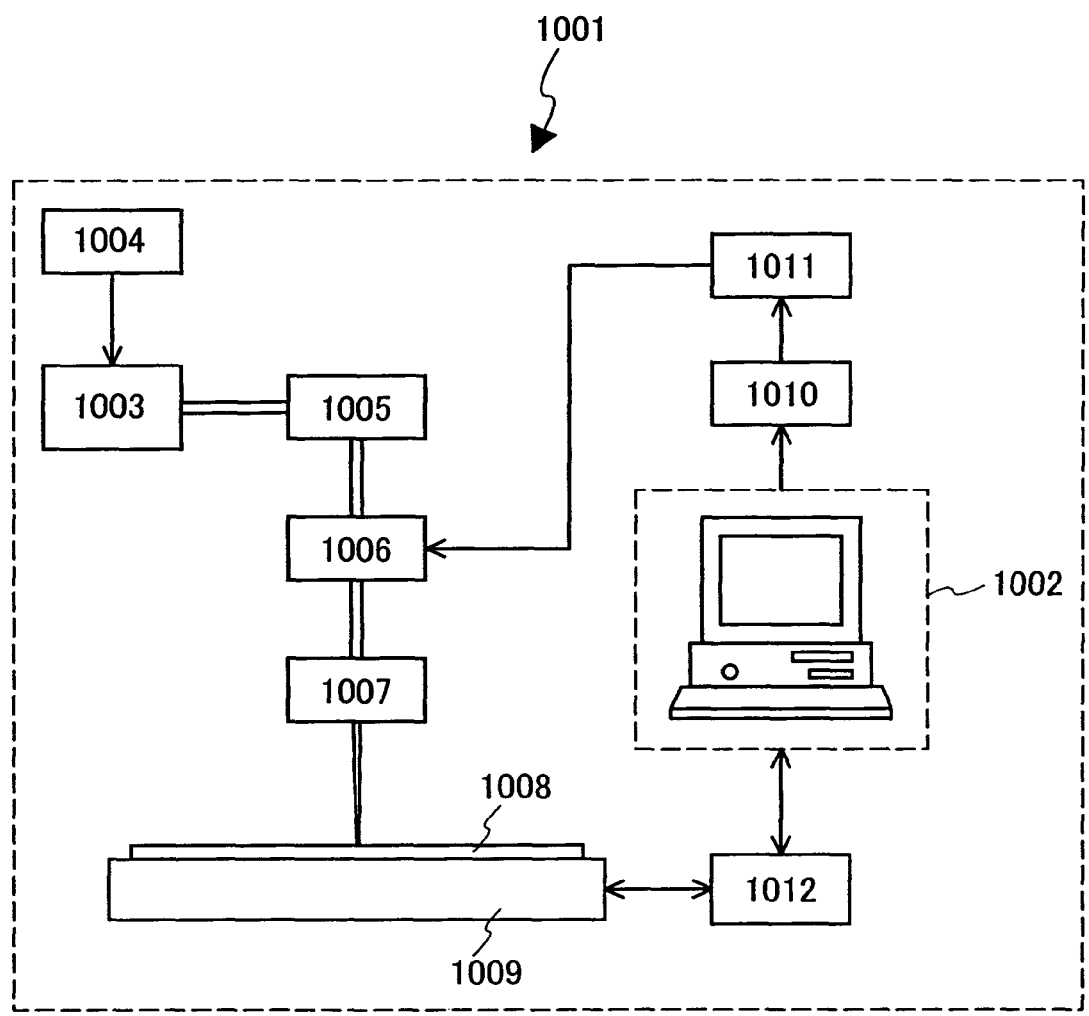
FIG. 22 is a diagram illustrating a laser beam direct writing system applicable to the invention.

Description is made with reference to FIG. 22 on a laser beam direct writing system. As shown in FIG. 22, a laser beam direct writing system 1001 includes a personal computer (hereinafter referred to as a PC) 1002 for performing various controls in irradiation of a laser beam, a laser oscillator 1003 for outputting a laser beam, a power supply 1004 of the laser oscillator 1003, an optical system (ND filter) 1005 for attenuating a laser beam, an acousto-optic modulator (AOM) 1006 for modulating the intensity of a laser beam, an optical system 1007 constituted by a lens for magnifying/reducing a cross section of a laser beam, a mirror for changing the optical path and the like, a substrate moving mechanism 1009 having an X stage and a Y stage, a D/A converter 1010 for converting the control data outputted from the PC to analog data, a driver 1011 for controlling the acousto-optic modulator 1006 according to an analog voltage outputted from the D/A converter, and a driver 1012 for outputting a drive signal for driving the substrate moving mechanism 1009.

As the laser oscillator 1003, a laser oscillator capable of oscillating ultraviolet light, visible light or infrared light can be used. The laser oscillator may be, for example, an excimer laser oscillator of KrF, ArF, XeCl, Xe or the like; a gas laser oscillator of He, He—Cd, Ar, He—Ne, HF or the like; a solid laser oscillator using crystals of YAG, $YVO_4$, YLF or $YAlO_3$ which are doped with Cr, Nd, Er, Ho, Ce, Co, Ti or Tm; or a semiconductor laser oscillator of GaN, GaAs, GaAlAs, InGaAsP or the like. As for the solid laser oscillator, the second to fifth harmonics of a fundamental wave are preferably employed.

Description is made below on an irradiation method of a laser beam using a laser beam direct writing system. When the substrate 1008 is placed on the substrate moving mechanism 1009, the PC 1002 detects the position of a marker formed on the substrate 1008 using a camera (not shown). Then, the PC 1002 produces movement data for moving the substrate moving mechanism 1009 based on the detected positional data of the marker and the preprogrammed data of the writing pattern. After that, the PC 1002 controls the amount of light outputted from the acousto-optic modulator 1006 via the driver 1011, and a laser beam outputted from the laser oscillator 1003 is, after attenuated by the optical system 1005, controlled by the acousto-optic modulator 1006 to have a predetermined quantity of light. Meanwhile, the laser beam outputted from the acousto-optic modulator 1006 is changed in its optical path and shape by the optical system 1007, and condensed with the lens. Then, a composition (first pattern) on the substrate is irradiated with the laser beam. At this time, the substrate moving mechanism 1009 is controlled to move in the X direction and the Y direction in accordance with the movement data produced by the PC 1002. As a result, a predetermined area is irradiated with the laser beam, thereby the third insulating layer 121 is formed.

Here, laser irradiation is performed by scanning a laser beam in the X-Y direction. In such a case, a polygon mirror, a galvanometer mirror or an acousto-optic deflector (AOD) is preferably used for the optical system 1007. In addition, the third insulating layer 121 may be formed in a predetermined region of the substrate by moving a laser beam in one direction of an X-axis or a Y-axis while moving the substrate in the opposite direction thereto.

Here, the third insulating layer is formed in a region which is irradiated with a laser beam. When irradiating a semiconductor film with a laser beam once, the third insulating layer has substantially the same width as the beam spot. In order to form the third insulating layer with a more minute width, the semiconductor film is preferably irradiated with a laser beam with a short wavelength. In this embodiment mode, a laser beam having a wavelength from ultraviolet light to infrared light is employed. As a result, the width of the beam spot can be narrowed.

The third insulating layer 121 functions as a mask for partially etching the semiconductor film 103 later. Therefore, by irradiation of the laser beam 111 having a narrow beam spot width, a semiconductor element can be formed to have a fine shape with a small area. The width of the beam spot is preferably 20 µm or less, or more preferably 0.5 to 15 µm. By forming the insulating layer functioning as a mask using a beam spot having such a width, a semiconductor device, in which semiconductor elements are highly integrated, can be formed.

Meanwhile, when forming a mask for forming a pixel electrode, a wiring or the like having relatively a large area, the width of the beam spot is preferably wide. By forming such an insulating layer functioning as a mask, the throughput can be improved.

Figure 25A:
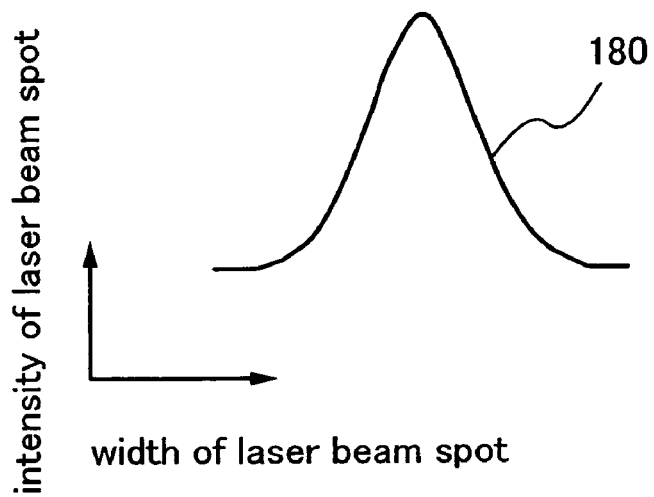
FIGS. 25A to 25C are top views illustrating the shape of a semiconductor layer in accordance with the invention.
Figure 25B:
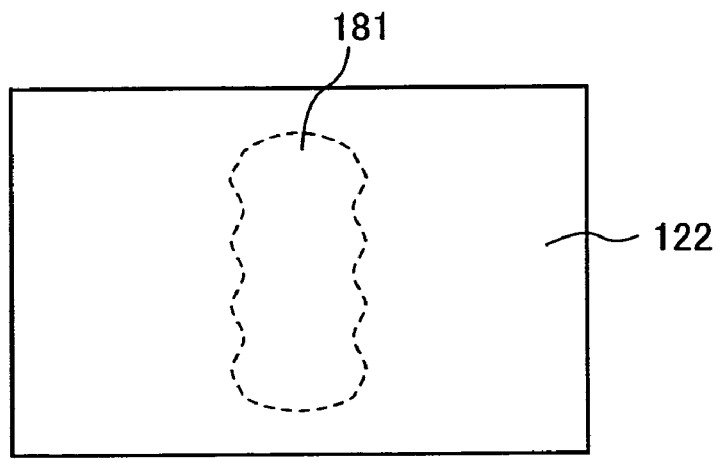

The intensity of the laser beam spot draws a Gaussian curve 180 as shown in FIG. 25A. The Gaussian curve splays out with a narrow top with respect to the width of a laser beam spot. FIG. 25B illustrates a top view of a substrate over which a third insulating layer is formed by scanning such a laser beam spot in one direction.

Figure 25C:
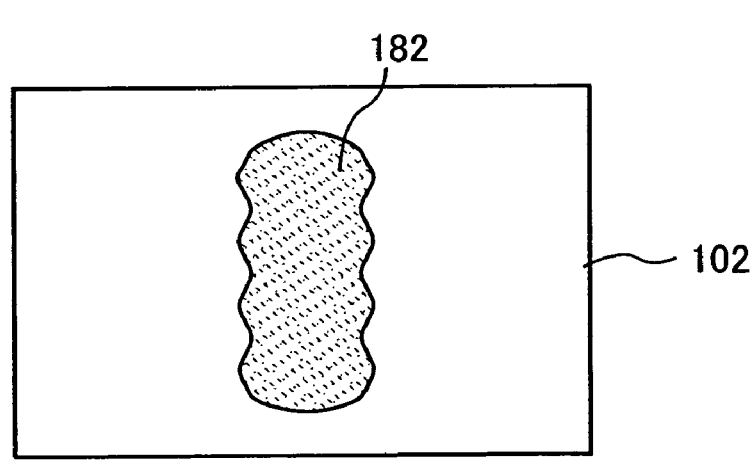

As shown in FIG. 25B, when a semiconductor film is irradiated with a laser beam which has the intensity of the Gaussian curve, a third insulating layer 181 having curved edges is formed. Note that a region surrounded by a dotted line corresponds to the third insulating layer 181. In addition, the fourth insulating layer 122 as a natural oxide film is formed around the third insulating layer 181. After removing the fourth insulating layer 122, the semiconductor film is etched using the third insulating layer 181 having such a shape as a mask, and then the mask is removed, thereby a semiconductor layer 182 can be formed to have curved edges, which typically are sequentially repeated curves as shown in FIG. 25C.

Figure 26A:
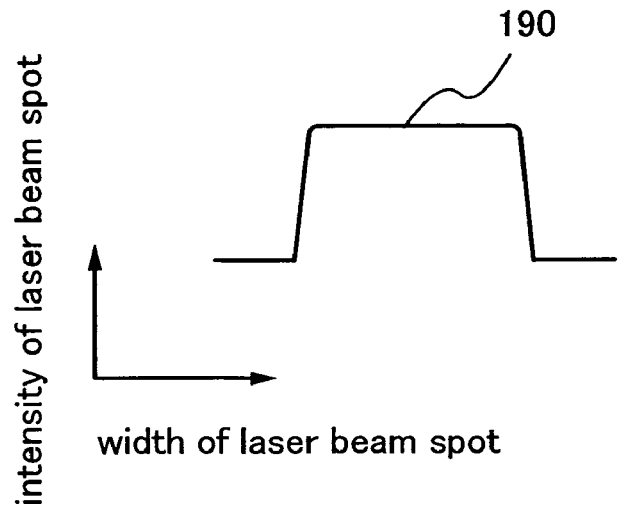
FIGS. 26A to 26C are top views illustrating the shape of a semiconductor layer in accordance with the invention.
Figure 26B:
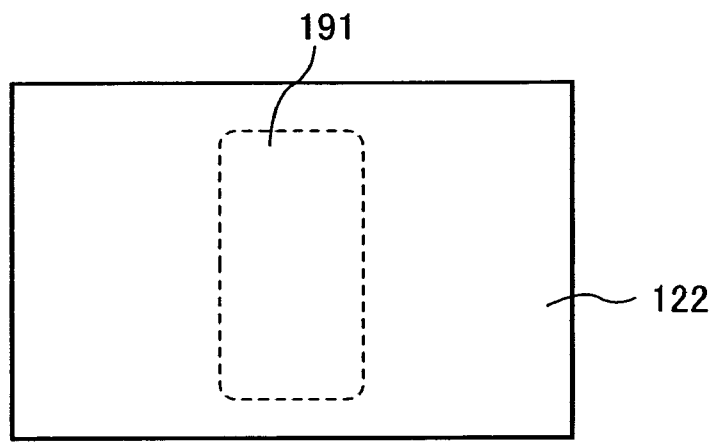

In addition to the optical system 1007 of the laser beam direct writing system in FIG. 22, a wavefront-converting optical element may be used for converting a laser beam spot to be intense enough to have a trapezoidal shape or a cuboid shape (having flat top). By using the wavefront-converting optical element, the laser beam spot can be made intense enough to have a trapezoidal shape or a cuboid shape as shown in FIG. 26A. Therefore, the energy intensity of such a laser beam spot can be constant (flat top). FIG. 26B illustrates a top view of a substrate over which a third insulating layer is formed by scanning such a laser beam spot in one direction.

Figure 26C:
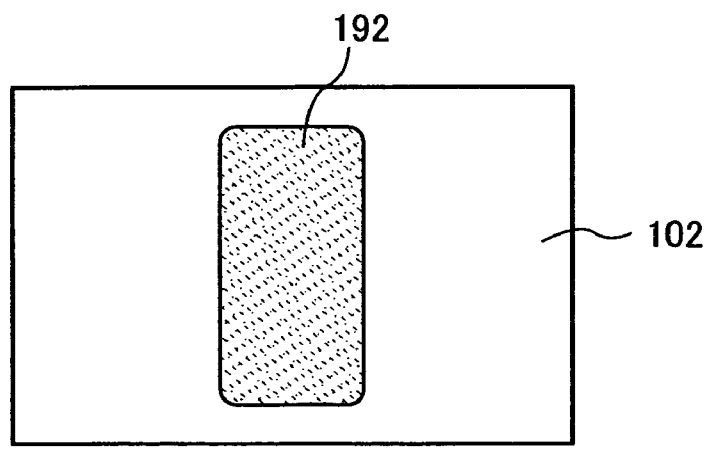

In FIG. 26B, when a semiconductor film is irradiated with a laser beam which is intense enough to have a trapezoidal shape or a cuboid shape, a third insulating layer 191 having linear edges is formed. Note that a region surrounded by a dotted line corresponds to the third insulating layer 191. In addition, the fourth insulating layer 122 as a natural oxide film is formed around the third insulating layer 191. After removing the fourth insulating layer 122, the semiconductor film is etched using the third insulating layer 191 having such a shape as a mask, and then the mask is removed, thereby a semiconductor layer 192 can be formed to have linear edges as shown in FIG. 26C.

As a typical example of the wavefront-converting optical element, there are a diffractive optical element, a refractive optical element, a reflective optical element, an optical waveguide and the like. As a typical example of the diffractive optical element, there are a holographic optical element, a binary optical element and the like. The optical waveguide can confine radiated light within a certain region, and transmit the energy flow in parallel with the axis of an optical path. The optical waveguide may be a light pipe or an optical fiber. The light pipe generally means a pipe for transmitting light from one end to the other end by utilizing reflection, which may have a conical shape, a pyramid shape, a cylindrical shape, a prismatic shape and the like. Note that the optical transmission may be carried out by using reflection on a mirror or using two reflecting planes facing each other and the like. A laser beam which enters the optical waveguide travels through the internal path by repeating reflection until it reaches the exit thereof. At the exit of the optical waveguide, a beam spot having a plane with a uniform density of optical energy is formed.

Alternatively, when a laser beam spot is not scanned but a portion of a semiconductor film is irradiated with a laser beam, a third insulating layer which is dependent on the shape of the beam spot can be formed. By etching the semiconductor film in a subsequent step using such a third insulating layer as a mask to expose the first insulating layer, and removing the mask, a semiconductor layer with a circular, oval or cuboid shape can be formed.

The laser beam 111 is preferably controlled to be intense enough for the semiconductor film 103 and the second insulating layer 104 to be activated and react easily, thereby an insulating layer is formed between the semiconductor film 103 and the second insulating layer 104. As a result, the semiconductor film 103 after being irradiated with a laser beam is not completely fused, and thus remains as an amorphous semiconductor film, an SAS or μc.

Figure 1D:
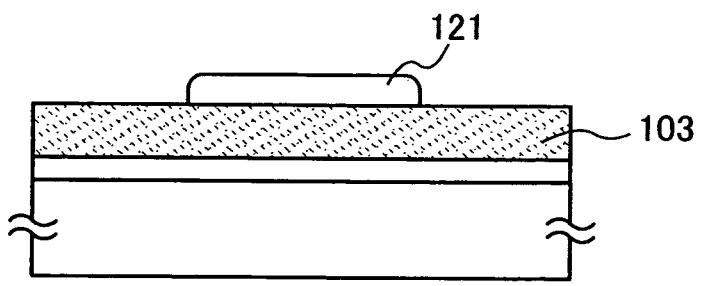

Next, as shown in FIG. 1D, the fourth insulating layer 122 is removed and the semiconductor film 103 is partially exposed so that the third insulating layer 121 remains on the semiconductor film.

As a method for removing the fourth insulating layer 122, a known method such as wet etching or dry etching is used. At this time, etching conditions are appropriately controlled so that the third insulating layer 121 remains.

Figure 1E:
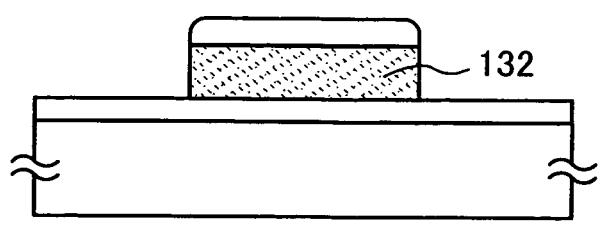

Then, as shown in FIG. 1E, the semiconductor film 103 is etched using the third insulating layer 121 as a mask to form a semiconductor layer 132 having a desired shape. As the method for etching the semiconductor film 103, dry etching or wet etching may be used. The dry etching may be performed by using a chlorine source gas typified by $Cl_2$, $BCl_3$, $SiCl_4$, $CCl_4$ or the like, a fluorine source gas typified by $CF_4$, $SF_6$, $NF_3$, $CHF_3$, $ClF_3$ or the like, or $O_2$. Meanwhile, the wet etching may be performed by using an alkaline solution such as an aqueous solution containing hydrazine or tetramethyl ammonium hydroxide (TMAH, chemical formula: $(CH_3)_4NOH$).

According to the aforementioned steps, a semiconductor layer having a fine shape can be formed without using a resist.

Embodiment Mode 2

In this embodiment mode, description is made with reference to FIGS. 2A to 2E on steps for forming a semiconductor layer (semiconductor island) having a desired shape which are different from the steps in Embodiment Mode 1. In this embodiment, the order of a removing step of the second insulating layer and a formation step of the third insulating layer is different from that in Embodiment Mode 1.

Figure 2A:
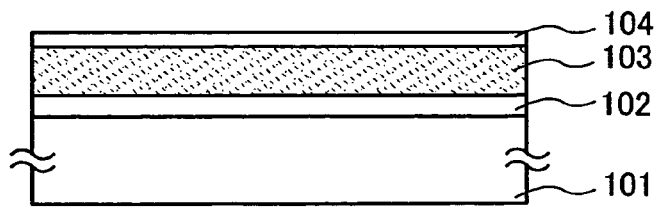
FIGS. 2A to 2E are cross-sectional views illustrating manufacturing steps of a semiconductor layer in accordance with the invention.

As shown in FIG. 2A, the first insulating layer 102 is formed over the substrate 101, over which the semiconductor film 103 is formed similarly to Embodiment Mode 1. At this time, the surface of the semiconductor film 103 is oxidized to form a second insulating layer 104 which may be a natural oxide layer.

Figure 2B:
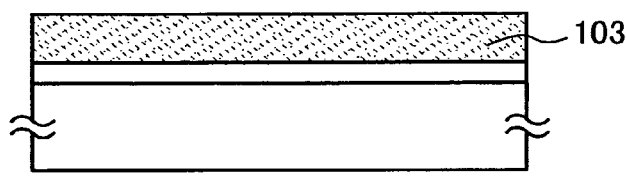

Then, as shown in FIG. 2B, the second insulating layer 104 is removed by wet etching, dry etching or the like to expose the semiconductor film 103.

Figure 2C:
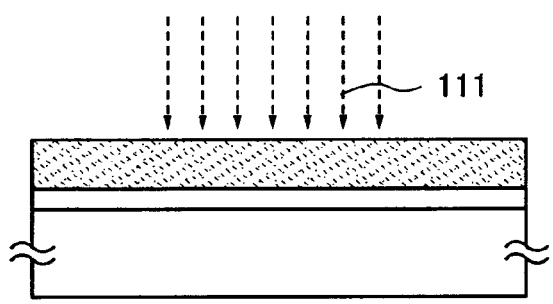
Figure 2D:
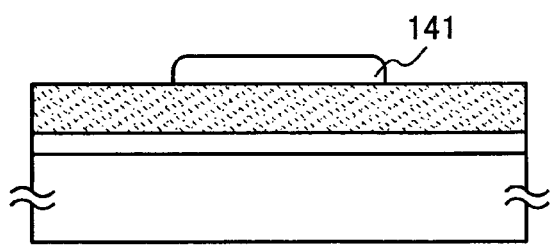

Then, as shown in FIG. 2C, the semiconductor film 103 is partially irradiated with the laser beam 111 similarly to Embodiment Mode 1, and a third insulating layer 141 is formed over the semiconductor film 103 as shown in FIG. 2D. Here, a laser beam emitted from a laser beam direct writing system is employed; therefore, the semiconductor film 103 can be irradiated with a laser beam with a minute diameter. Thus, the third insulating layer 141 also has a fine shape.

The third insulating layer 141 is formed of an oxide layer, typically a semiconductor oxide layer. The third insulating layer 141 functions as a mask for etching the semiconductor film 103 later; therefore, the third insulating layer 141 is preferably twice or more thicker than the second insulating layer 104. In addition, the third insulating layer 141 is preferably a dense insulating layer, and the etching rate thereof is preferably lower, and typically half or less of that of the second insulating layer 104.

Figure 2E:
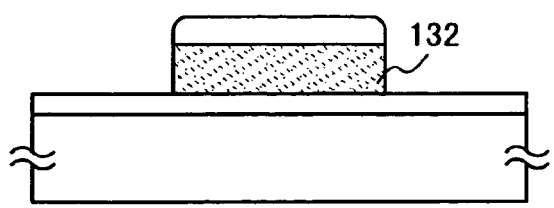

Then, as shown in FIG. 2E, the semiconductor film 103 is etched using the third insulating layer 141 as a mask to form the semiconductor layer 132.

According to the aforementioned steps, a semiconductor layer having a desired shape can be formed without using a resist.

Embodiment Mode 3

In this embodiment mode, description is made with reference to FIGS. 3A to 3E on steps for forming a semiconductor layer (semiconductor island) having a different crystalline state from that in Embodiment Mode 1 or Embodiment Mode 2. Note that in this embodiment mode, description is made with reference to the order of steps in Embodiment Mode 1; however, the order of steps in Embodiment Mode 2 may be employed as well.

Figure 3A:
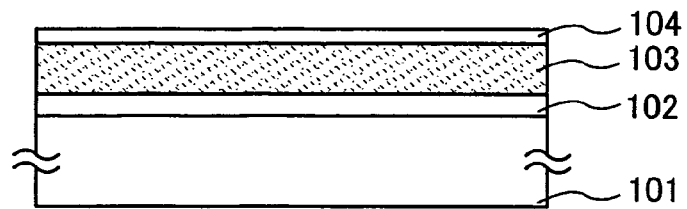
FIGS. 3A to 3E are cross-sectional views illustrating manufacturing steps of a semiconductor device in accordance with the invention.

As shown in FIG. 3A, the first insulating layer 102 is formed over the substrate 101, over which the semiconductor film 103 is formed similarly to Embodiment Mode 1. At this time, the surface of the semiconductor film 103 is oxidized to form the second insulating layer 104 which may be a natural oxide layer.

Figure 3B:
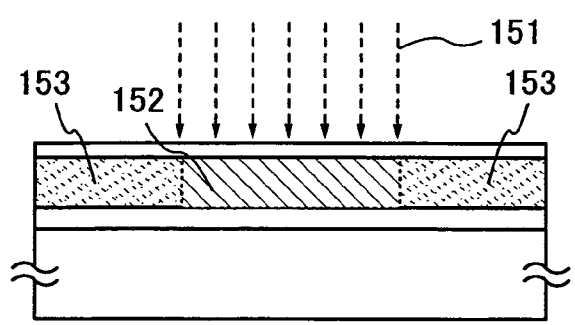

Subsequently, as shown in FIG. 3B, the second insulating layer 104 is partially irradiated with a laser beam 151. Here, a laser beam emitted from a laser beam direct writing system is employed; therefore, the semiconductor film 103 can be irradiated with a laser beam with a minute diameter. At this time, the semiconductor film 103 of the region irradiated with a laser beam is fused by controlling the intensity of the laser beam. On the periphery of a fused region 152 of the semiconductor film, an unfused semiconductor film 153 remains.

Figure 3C:
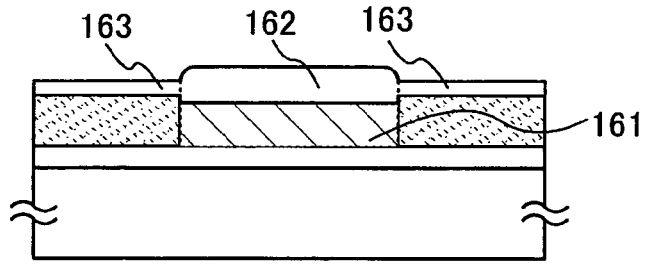

After that, by naturally cooling the fused semiconductor, a third insulating layer 162 is formed by the semiconductor film oxidized due to the laser irradiation as well as a crystalline semiconductor film 161 is formed as shown in FIG. 3C. The third insulating layer 162 is an oxide layer, typically a semiconductor oxide layer.

On the periphery of the third insulating layer 162, the second insulating layer 104 remains. Here, the second insulating layer 104 remaining on the periphery of the third insulating layer 162 is referred to as a fourth insulating layer 163. The third insulating layer 162 is preferably twice or more thicker than the fourth insulating layer 163. In addition, the third insulating layer 162 is preferably a dense insulating layer, and an etching rate thereof is preferably smaller than, and typically half or less of that of the second insulating layer.

Figure 3D:
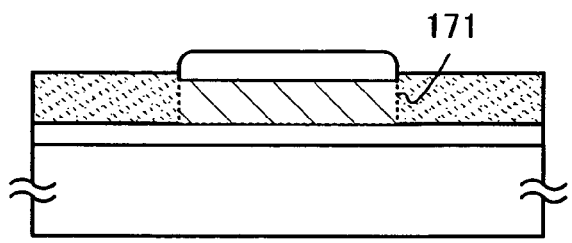

Then, as shown in FIG. 3D, the fourth insulating layer 163 is removed by wet etching, dry etching or the like to expose the semiconductor film 103. According to this step, the third insulating layer 162 functioning as a mask can be formed. Note that the etching conditions are appropriately controlled so that the third insulating layer 162 can remain.

Figure 3E:
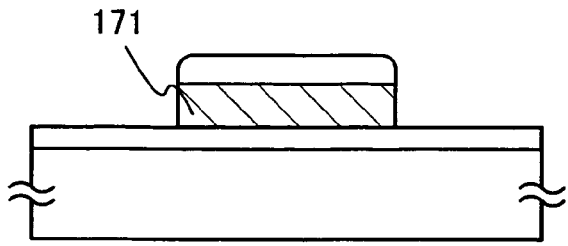

Then, as shown in FIG. 3E, the semiconductor film 103 is etched using the third insulating layer 162 as a mask to form a semiconductor layer 171 having a desired shape. As a method for etching the semiconductor film 103, the dry etching, the wet etching or the like shown in Embodiment Mode 1 is appropriately used. Here, the semiconductor layer 171 having crystallinity remains since the semiconductor film 103 is etched using the third insulating layer 162 as a mask.

According to the aforementioned steps, a semiconductor layer having a fine shape and crystallinity can be formed without using a resist.

Embodiment Mode 4

In this embodiment mode, description is made with reference to FIGS. 4A to 4E on a method for manufacturing a semiconductor element. In this embodiment mode, description is made using a channel-etched TFT of an inversely staggered structure as a typical example of the semiconductor element. In addition, in the following Embodiment Modes 4 to 7, description is made on steps for forming a semiconductor element with reference to Embodiment Mode 2; however, the invention is not limited thereto, and Embodiment Mode 1 or 3 can be appropriately used.

Figure 4A:
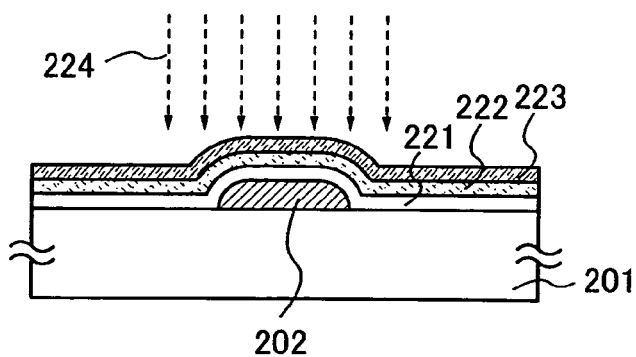
FIGS. 4A to 4E are cross-sectional views illustrating manufacturing steps of a semiconductor device in accordance with the invention.

As shown in FIG. 4A, a first conductive layer 202 is formed over a substrate 201. The first conductive layer 202 is formed by appropriately selecting metals such as Ag, Au, Cu, Ni, Pt, Pd, Ir, Rh, W, Al, Ta, Mo, Cd, Zn, Fe, Ti, Si, Ge, Zr and Ba, metal nitride of such metals, or ITO (indium tin oxide), ITO containing silicon oxide as a composition, organic indium, organotin, zinc oxide (ZnO) or the like which is used as a light-transmissive conductive film. As a method for forming the first conductive layer 202, a droplet discharge method, printing, electrolytic plating, PVD, or CVD is appropriately selected.

When the first conductive layer is formed by PVD or CVD, a mask is formed over a conductive film by dropping a photosensitive material using a droplet discharge method or by light exposure and development of a photosensitive material using a photolithography step and a laser beam direct writing system. Then, the conductive film is etched to have a desired shape using the mask to form the first conductive layer.

Alternatively, when the first conductive layer is formed by a droplet discharge method, a composition in which the aforementioned metal particles are dissolved or dispersed in an organic resin is discharged from a discharge head (hereinafter also referred to as a nozzle). The organic resin includes one or more of organic resins functioning as a binder of metal particles, a solvent, a dispersing agent, and a coating agent. Typically, a known organic resin such as a polyimide resin, an acrylic resin, a novolac resin, a melamine resin, a phenol resin, an epoxy resin, a silicone resin, a furan resin, and a diallyl phthalate resin can be used.

The viscosity of the composition is preferably in the range of 5 to 20 mPa·s so that drying would not occur and the metal particles can be smoothly discharged from the discharge head. The surface tension of the composition is preferably 40 mN/m or less. Further, the viscosity of the composition or the like may be appropriately adjusted in accordance with a solvent to be used and application thereof.

The diameter of the metal particles contained in the composition depends on the diameter of each nozzle or a desired pattern shape; however, it is preferably as small as possible, e.g., 0.1 μm or less, to prevent clogging of a nozzle or to manufacture a high-definition pattern. The metal particles are formed by a known method such as an electrolytic method, an atomizing method or a wet reduction method, and the size of each particle is typically about 0.5 nm to 10 μm. However, when a gas evaporation method is employed, nanomolecules protected by a dispersing agent is as minute as about 7 nm. When the surface of each nanoparticle is covered with a coating agent, the nanoparticles do not clump together in the solvent and are uniformly dispersed at a room temperature, thereby exhibiting substantially the same behavior as a liquid.

A step for discharging the composition may be performed under low pressure. This is because the organic resin of the composition vaporizes before the discharged composition is landed on the processing object, which can decrease the energy density of a laser beam in the step for baking metal particles.

In this embodiment mode, a droplet discharge method is used to selectively discharge an Ag paste in which silver particles of several nanometers is dispersed onto the substrate 201, which is then baked to form the first conductive layer 202 having the baked silver particles. In the first conductive layer 202, conductive fine particles overlap one another irregularly in three dimensions. That is, the first conductive layer 202 is constituted by the three dimensional aggregate particles. Accordingly, the surface thereof has minute irregularities. According to the temperature and time for heating the first conductive layer 202, the fine particles are baked and the diameter of the particles is increased, thus the surface of the first conductive layer 202 has a large difference of elevation. In addition, there might be a case where a region in which the fine particles are fused has a polycrystalline structure. In this case, an etching step using a mask pattern is not required; therefore, the manufacturing step can be drastically simplified.

Then, a first insulating layer 221 functioning as a gate insulating film, a first semiconductor film 222 and a second conductive semiconductor film 223 are formed over the first conductive layer 202.

The first insulating layer 221 is formed to have a single-layer structure or a stacked-layer structure of silicon nitride, silicon oxide, and an insulating film containing other silicon by a thin-film formation method such as plasma CVD or sputtering. In addition, the first insulating layer preferably has a stacked-layer structure in which a silicon nitride film (silicon nitride oxide film), a silicon oxide film and a silicon nitride film (silicon nitride oxide film) are stacked from a side which is in contact with the first conductive layer 202. In this structure, a gate electrode is in contact with the silicon nitride film, thus degradation due to oxidation can be prevented.

The first semiconductor film 222 is formed of a film having any state selected from an amorphous semiconductor, an SAS, μc and a crystalline semiconductor. In any case, the first semiconductor film 222 is formed to contain silicon, silicon germanium (SiGe) or the like as a main component, and the film thickness thereof is preferably set in the range of 10 to 100 nm, or more preferably 20 to 60 nm.

A crystalline semiconductor film can be formed by crystallizing an amorphous semiconductor film or an SAS by heating or laser irradiation. Alternatively, a crystalline semiconductor film may be directly formed.

Further, a crystalline semiconductor film may be formed by adding a metal catalyst such as titanium (Ti), nickel (Ni), tungsten (W), molybdenum (Mo), cobalt (Co), zirconium (Zr), tantalum (Ta), vanadium (V), niobium (Nb), chromium (Cr), platinum (Pt), and palladium (Pd) into an amorphous semiconductor film, and heating it. However, when the crystalline semiconductor film is formed by such a method, the metal catalyst is preferably removed in a subsequent step. As a method for removing the metal catalyst, there are a method of adding impurities (typically, argon, phosphorus or a rare gas) partially into the crystalline semiconductor film, heating it and then moving catalytic elements to the region to which the impurities are added; forming a semiconductor film having the aforementioned impurities on the surface of the crystalline semiconductor film, heating it and then moving catalytic elements to the semiconductor film having the impurities; and the like.

The second semiconductor film 223 is formed of a conductive amorphous semiconductor, an SAS or μc. In the case of forming an n-channel TFT, a Group 15 element of the periodic table, typically phosphorus or arsenic, is added. In the case of forming a p-channel TFT, on the other hand, a Group 13 element of the periodic table, typically boron, is added. The second semiconductor film is formed by plasma CVD using a silicon source gas added with a Group 13 element or Group 15 element such as boron, phosphorus or arsenic.

Figure 4B:
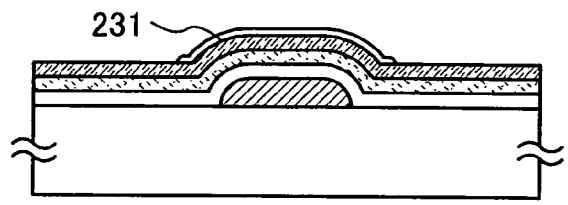

Then, after removing an oxide film formed on the surface of the second semiconductor film 223, the second semiconductor film is partially irradiated with a laser beam 224. Here, a laser beam emitted from a laser beam direct writing system is employed. As a result, a second insulating layer 231 is formed as shown in FIG. 4B. Here, the second semiconductor film 223 is partially oxidized by the energy of the laser beam to form a silicon oxide film as the second insulating layer. In addition, the second semiconductor film is not completely fused, and thus remains as an amorphous semiconductor, an SAS or μc.

Figure 4C:
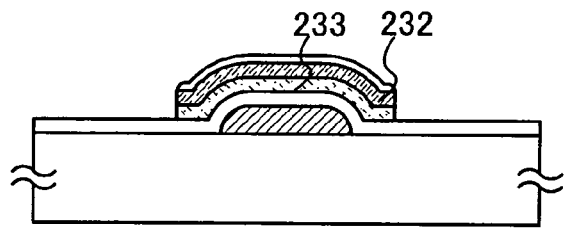
Figure 4D:
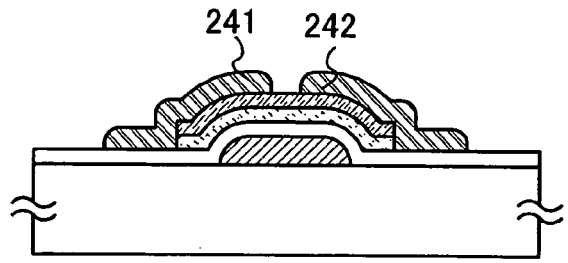
Figure 4E:
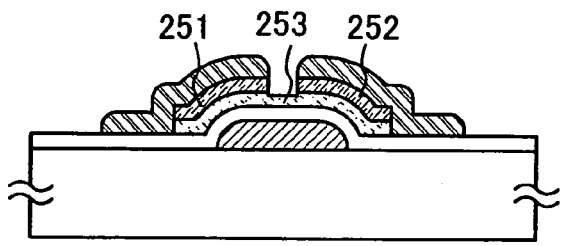

Then, as shown in FIG. 4C, the second semiconductor film 223 is etched using the second insulating layer 231 as a mask to form a second semiconductor layer 232. Then, the first semiconductor film 222 is etched using the second insulating layer 231 as a mask to form a first semiconductor layer 233. After that, the second insulating layer 231 is removed.

The first semiconductor film and the second semiconductor film can be etched by appropriately using the method for etching the first semiconductor film shown in Embodiment Mode 1.

Then, second conductive layers 241 and 242 functioning as a source electrode and a drain electrode are formed using a conductive material over the second semiconductor layer 232. The second conductive layers 241 and 242 are formed by appropriately using the material and method for forming the first conductive layer 202 shown in this embodiment mode. Here, an Ag paste which is dispersed with silver particles of several nanometers is selectively discharged and baked to form the second conductive layers 241 and 242.

Then, an exposed portion of the second semiconductor layer 232 is etched to be segmented using the second conductive layers 241 and 242 as masks, thereby third semiconductor layers 251 and 252 functioning as a source region and a drain region are formed. In this step, the first semiconductor layer 233 which is partially etched is referred to as a fourth semiconductor layer 253. The fourth semiconductor layer 253 functions as a channel region.

When the fourth semiconductor layer is formed of an SAS or a crystalline semiconductor film, a structure as shown in this embodiment mode may be employed, in which the first conductive layer functioning as a gate electrode is covered with the third semiconductor layers functioning as a source region and a drain region. Alternatively, a so-called self-aligned structure may be employed, in which edges of the third semiconductor layers are aligned with edges of the first conductive layer. Further, such a structure may be employed that the third semiconductor layers are formed at a certain distance from each other without covering the first conductive layer. This structure can reduce off-current; therefore, when the TFT is used as a switching element of a display device, the contrast can be enhanced. Further, a TFT may be formed to have a so-called multi-gate structure in which a plurality of the first conductive layers are covered with the fourth semiconductor layer. In this case also, off-current can be reduced.

Then, a passivation film is preferably formed over the second conductive layers 241 and 242 and the third semiconductor layer 253. The passivation film can be formed by a thin-film formation method such as plasma CVD or sputtering using silicon nitride, silicon oxide, silicon nitride oxide, silicon oxynitride, aluminum oxynitride, aluminum oxide, diamond-like carbon (DLC), nitrogen-containing carbon (CN), or other insulating materials.

According to the aforementioned steps, a channel-etched TFT having a semiconductor layer with a fine shape can be manufactured. Further, a highly integrated semiconductor device with few variations can be manufactured.

Embodiment Mode 5

In this embodiment mode, description is made with reference to FIGS. 5A to 5F on a channel-protected TFT having a bottom-gate structure as an example of a semiconductor element.

Figure 5A:
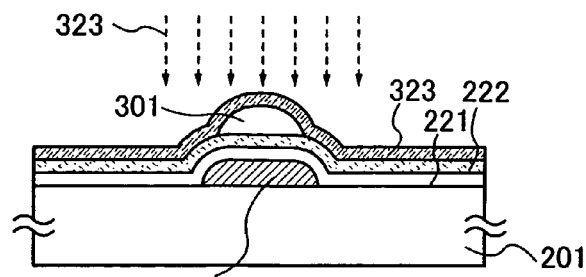
FIGS. 5A to 5F are cross-sectional views illustrating manufacturing steps of a semiconductor device in accordance with the invention.

As shown in FIG. 5A, the first conductive layer 202 functioning as a gate electrode is formed over the substrate 201 through similar steps to Embodiment Mode 4, and then the first insulating layer 221 functioning as a gate insulating film and the first semiconductor film 222 are formed. Then, a protective film 301 is formed in a region overlapping with the first conductive layer 202 and over the first semiconductor film 222.

The protective film 301 is preferably formed by using a heat-resistant high-molecular-weight material. In addition, the protective film 301 is preferably formed by discharging a high-molecular-weight material having an aromatic ring and a heterocycle as a main chain and containing a heteroatom group with less aliphatic moiety and high polarity. As a typical example of such a high-molecular-weight material, there is polyimide, polybenzimidazole or the like. When using polyimide, the protective film 301 can be formed by discharging a solution containing polyimide from a discharge head onto the first semiconductor film 222, and then baking it at 200° C. for 30 minutes.

Subsequently, a second semiconductor film (conductive semiconductor film) 323 is formed. The second semiconductor film 323 can be formed by using a similar material and manufacturing method to the second semiconductor film 223 in Embodiment Mode 2.

Figure 5B:
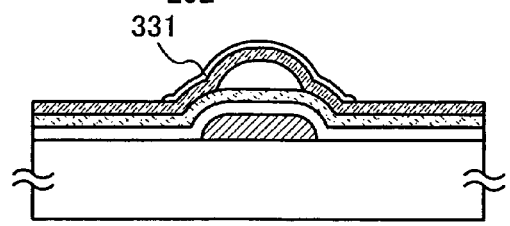

Then, an oxide film formed on the surface of the second semiconductor film 323 is removed, and the second semiconductor film 323 is partially irradiated with the laser beam 224. Here, a laser beam emitted from a laser beam direct writing system is employed. As a result, a second insulating layer 331 is formed as shown in FIG. 5B. Here, the second semiconductor film 323 is partially oxidized by the energy of the laser beam to form a silicon oxide film as the second insulating layer.

Figure 5C:
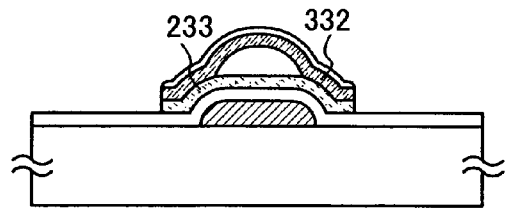

Then, as shown in FIG. 5C, the second semiconductor film 323 is etched using the second insulating film 331 as a mask to form a first semiconductor layer 332. Then, the first semiconductor film 222 is etched using the second insulating layer 331 as a mask in a similar manner to Embodiment Mode 4 to form the second semiconductor layer 233. After that, the second insulating layer 331 is removed.

Figure 5D:
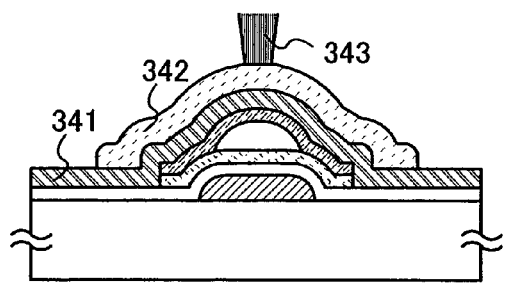

Then, as shown in FIG. 5D, a second conductive layer 341 is formed by using a conductive material. As for the second conductive layer 341, the material and method for forming the first conductive layer 202 shown in Embodiment Mode 4 are appropriately used. Here, the second conductive layer 341 having a stacked-layer structure of a molybdenum film, an aluminum film and a molybdenum film is formed by sputtering.

Then, a photosensitive material 342 is discharged or applied onto the second conductive layer 341, and then dried. As the photosensitive material, a negative photosensitive material or a positive photosensitive material which is photosensitive to light ranging from ultraviolet light to infrared light is used.

As the photosensitive material, a photosensitive resin material such as an epoxy resin, an acrylic resin, a phenol resin, a novolac resin, a melamine resin and an urethane resin is used. In addition, a photosensitive organic material such as benzocyclobutene, parylene, flare and polyimide can be used. As a typical positive photosensitive material, there are a photosensitive material containing a novolac resin and a naphtho quinonediazide compound which is a photosensitizing agent. As a typical negative photosensitive material, there are a photosensitive material containing a base resin, diphenyl silane diol, an acid generating agent and the like. In this embodiment mode, the negative photosensitive material is used.

Figure 5E:
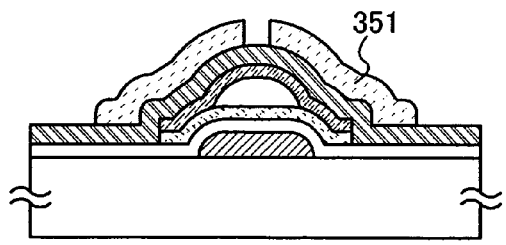

Then, the photosensitive material 342 is irradiated with to a laser beam 343 using a laser beam direct writing system to be exposed to light, and then developed. As a result, a mask 351 as shown in FIG. 5E is formed.

Figure 5F:
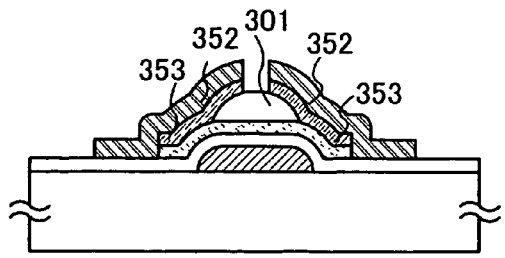

Then, as shown in FIG. 5F, the second conductive layer 341 is etched using the mask 351 to form third conductive layers 352 functioning as a source electrode and a drain electrode respectively. In addition, the first semiconductor layer 332 is etched using the mask 351 to form third semiconductor layers 353 functioning as a source region and a drain region respectively. According to this step, the protective film 301 is exposed.

Note that the method for forming the third conductive layers 352 functioning as a source electrode and a drain electrode is not limited to this embodiment mode, and the step of forming the second conductive layers 241 and 242 shown in Embodiment Mode 4 may be used as well. In addition, the step of forming the third conductive layers 352 functioning as a source electrode and a drain electrode in this embodiment mode may be applied to the steps of forming the second conductive layers 241 and 242 in Embodiment Mode 4.

After that, a passivation film is preferably formed over the third conductive layer 352 similarly to Embodiment Mode 4.

According to the aforementioned steps, a channel-protected TFT having a semiconductor layer with a fine shape can be manufactured. In addition, a highly-integrated semiconductor device with few variations can be manufactured.

Embodiment Mode 6

In this embodiment mode, description is made with reference to FIGS. 6A to 6E on a method for manufacturing a staggered TFT having a top-gate structure.

Figure 6A:
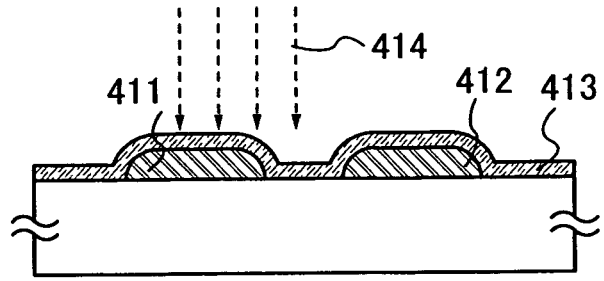
FIGS. 6A to 6E are cross-sectional views illustrating manufacturing steps of a semiconductor device in accordance with the invention.

As shown in FIG. 6A, first conductive layers 411 and 412 are formed over the substrate 201. The first conductive layers 411 and 412 can be formed by appropriately using a similar material and manufacturing method to the first conductive layer 202 in Embodiment Mode 4.

Then, a first conductive semiconductor film 413 is formed over the first conductive layers 411 and 412. The first semiconductor film 413 can be formed by appropriately using a similar material and manufacturing method to the second semiconductor film 223 shown in Embodiment Mode 4.

Figure 6B:
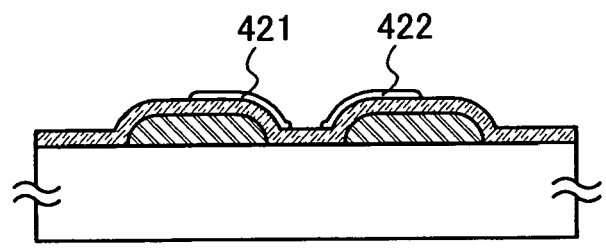

Then, an oxide film formed on the surface of the first semiconductor film 413 is removed, and the first semiconductor film 413 is partially irradiated with the laser beam 414 to form first insulating layers 421 and 422 functioning as first masks as shown in FIG. 6B.

Figure 6C:
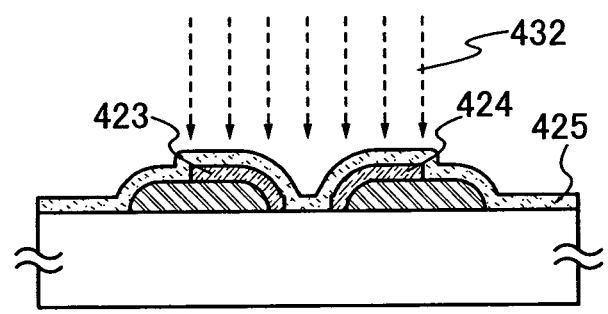

Then, the first semiconductor film 413 is etched using the first insulating layers 421 and 422 as masks to form first semiconductor layers 423 and 424 as shown in FIG. 6C. The first semiconductor layers 423 and 424 function as a source region and a drain region. Subsequently, a second semiconductor film 425 is formed. The second semiconductor film 425 can be formed by appropriately using a similar material and manufacturing method to the first semiconductor film 222 shown in Embodiment Mode 4.

Figure 6D:
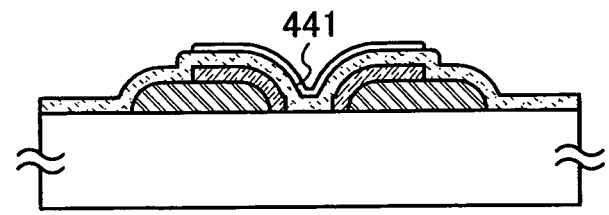

Then, the second semiconductor film 425 is partially irradiated with a laser beam 432 to form a second insulating layer 441 functioning as a second as mask as shown in FIG. 6D.

Figure 6E:
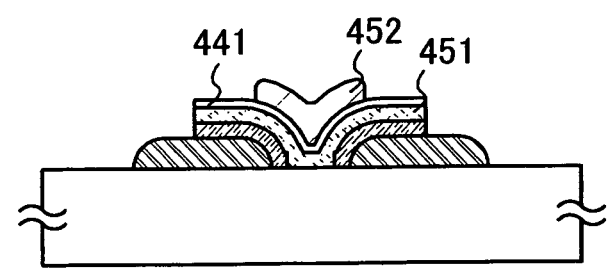

Then, the exposed portion of the second semiconductor film 425 is etched by using TMAH (tetramethyl ammonium hydroxide) to form a second semiconductor layer 451 as shown in FIG. 6E. The second semiconductor layer 451 functions as a channel region.

Then, a second conductive layer 452 functioning as a gate electrode is formed over the second insulating layer 441. The second conductive layer 452 is formed by using a similar material and manufacturing method to the first conductive layer 202 in Embodiment Mode 4. In addition, the second insulating layer 441 functions as a gate insulating film. After the second insulating layer 441 is removed, another insulating layer functioning as a gate insulating film may be formed by appropriately using a similar material and manufacturing method to the first insulating layer 221 in Embodiment Mode 4.

According to the aforementioned steps, a staggered TFT having a semiconductor layer with a fine shape can be manufactured. In addition, a highly-integrated semiconductor device with few variations can be manufactured.

Embodiment Mode 7

In this embodiment mode, description is made with reference to FIGS. 7A to 7E on a method for manufacturing a coplanar TFT having a top-gate structure.

Figure 7A:
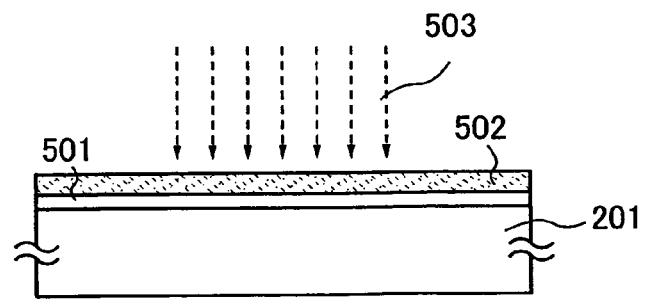
FIGS. 7A to 7E are cross-sectional views illustrating manufacturing steps of a semiconductor device in accordance with the invention.
Figure 7B:
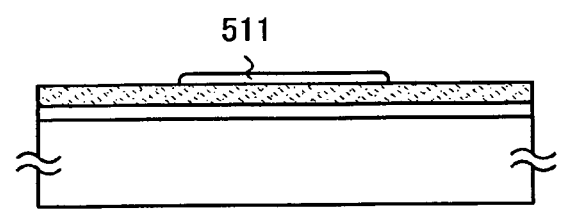

As shown in FIG. 7A, a first insulating layer 501 is formed over the substrate 201. The first insulating layer 501 functions as a blocking film for preventing impurity diffusion from the substrate into a semiconductor layer formed later. Therefore, the first insulating layer 501 is formed of an insulating film such as a silicon oxide film, a silicon nitride film and a silicon oxynitride film. The first insulating layer 501 is formed to have a single-layer structure or a stacked-layer structure having two or more layers. Subsequently, a semiconductor film 502 is formed over the first insulating layer 501. Then, an oxide film, which may be a natural oxide film, formed on the surface of the semiconductor film 502 is removed and a predetermined region of the semiconductor film 502 is irradiated with a laser beam 503 similarly to Embodiment Mode 4 to form a second insulating layer 511 as shown in FIG. 7B.

Figure 7C:
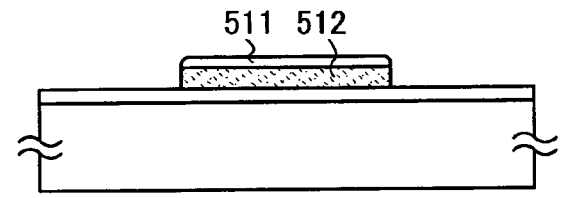

Then, as shown in FIG. 7C, the semiconductor film 502 is etched with the second insulating layer 511 as a mask by using TMAH to form a semiconductor layer 512.

Figure 7D:
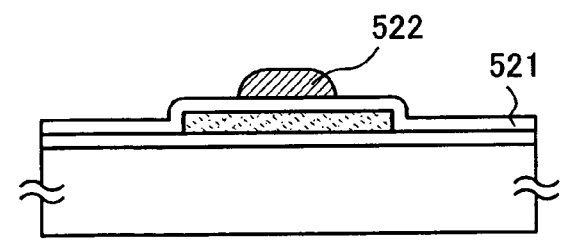

Then, as shown in FIG. 7D, the second insulating layer 511 is removed. Then, a third insulating layer 521 functioning as a gate insulating film is formed over the semiconductor layer 512 and the first insulating layer 501. The second insulating layer 511 can be formed by using a similar material and manufacturing method to the first insulating layer 221 shown in Embodiment Mode 4.

Then, a first conductive layer 522 is formed. The first conductive layer 522 can be formed by using a similar material and manufacturing method to the first conductive layer 202 shown in Embodiment Mode 4. Further, the first conductive layer 522 functions as a gate electrode.

Figure 7E:
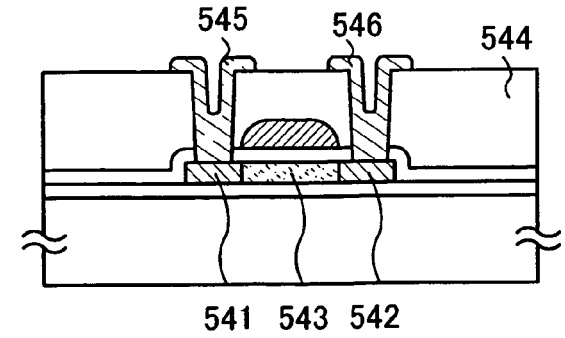

Then, as shown in FIG. 7E, impurities are added into the semiconductor layer 512 using the first conductive layer 522 as a mask. Then, after forming an insulating film containing hydrogen, the impurity elements added to the semiconductor layer are activated by heating up to 400 to 550° C. In addition, the semiconductor layer is hydrogenated to form impurity regions (source and drain regions) 541 and 542. The semiconductor layer covered with the first conductive layer 522 functions as a channel region 543. Further, GRTA, LRTA, or laser annealing can be used for the activation step and the hydrogenation step instead of the heat treatment.

Note that a single-gate TFT is described in this embodiment mode; however, the invention is not limited to this and a multi-gate TFT may be used. In addition, a self-aligned TFT is described here; however, the invention is not limited to this and a TFT having an LDD (Lightly Doped Drain) structure or a GOLD (Gate-drain Overlapped LDD) structure can be used. The LDD structure is obtained by forming a region doped with a low concentration of impurity elements between a channel region and a source or drain region which is formed by doping a high concentration of impurity elements. Such a region is called an LDD region. The TFT having such a structure can reduce the off-current value. The GOLD structure can be obtained by forming the LDD region so as to overlap a gate electrode with a gate insulating film interposed therebetween. This structure is effective in reducing an electric field in the vicinity of the drain and preventing degradation due to the injected hot carrier.

Then, a fourth insulating layer 544 is formed over the substrate. The fourth insulating layer may be formed by using an inorganic insulating material such as silicon oxide, silicon nitride, silicon oxynitride, aluminum oxide, aluminum nitride and aluminum oxynitride; a heat-resistant polymers such as acrylic acid, methacrylic acid, a derivative thereof, polyimide, aromatic polyimide and polybenzimidazole; an inorganic siloxane polymer which is formed by using a siloxane polymer material typified by a silica glass as a starting material, and which has Si—O—Si bonds of a compound of silicon, oxygen and hydrogen; an insulating material of an organic silicon polymer which is typified by an alkyl siloxane polymer, an alkyl silsesquioxane polymer, a hydrosilsesquioxane polymer and a hydroalkly silsesquioxane polymer, of which hydrogen bonded with silicon is substituted by an organic group such as methyl or phenyl. As a method for forming the fourth insulating layer 544, a known method such as CVD, coating and printing is used. When the fourth insulating layer 544 is formed by coating, the surface of the fourth insulating layer 544 can be planarized, and thus becomes suitable for the formation of a pixel electrode later. Here, the fourth insulating layer 544 is formed by coating.

Then, a mask pattern is formed by a droplet discharge method. Using the mask pattern, the fourth insulating layer 544 and the third insulating layer 521 are partially removed to partially expose the impurity regions 541 and 542 in the semiconductor layer, thereby openings are formed. Second conductive layers 545 and 546 are formed in the openings by appropriately using a similar method to the first conductive layer 202 in Embodiment Mode 4. The second conductive layers 545 and 546 function as source and drain electrodes.

According to the aforementioned steps, a coplanar TFT having a semiconductor layer with a fine shape can be manufactured. In addition, a highly-integrated semiconductor device with few variations can be manufactured.

Embodiment 1

Figure 11:
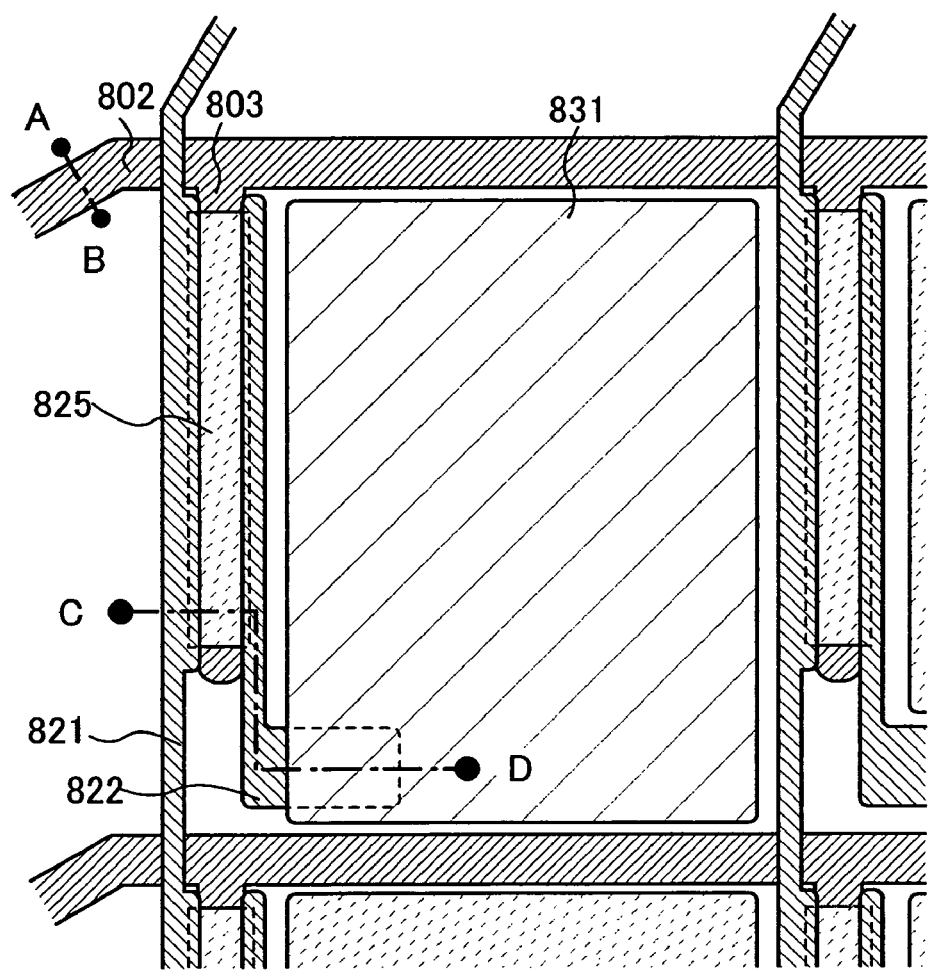
FIG. 11 is a top view illustrating manufacturing steps of a semiconductor device in accordance with the invention.

Next, description is made with reference to FIGS. 8A to 11 on a method for manufacturing an active matrix substrate and a display panel having the active matrix substrate. In this embodiment, description is made on a liquid crystal display panel as a typical example of the display panel. FIG. 11 is a top view of an active matrix substrate, and FIGS. 8A to 10B schematically illustrate cross-sectional structures of FIG. 11 along a line A-B of a connecting terminal portion and a line C-D of a pixel portion.

As shown in FIG. 8A; first conductive layers 802 and 803 are formed over the surface of a substrate 801. The first conductive layers are formed by discharging a composition which is formed of an organic resin and metallic particles such as Ag, Au, Cu, Ni, Pt, Pd, Ir, Rh, W, Al, Ta, Mo, Cd, Zn, Fe, Ti, Si, Ge, Zr and Ba, and baking it. The first conducive layer 802 functions as a gate line later while the first conductive layer 803 functions as a gate electrode later. Here, the substrate 801 is formed of a glass substrate: AN100 (product of Asahi Glass Co., Ltd.). In addition, using a droplet discharge method, a composition dispersed with Ag (silver) particles is discharged and heated to form the first conductive layers 802 and 803.

Then, a gate insulating film 804 is formed by CVD. As the gate insulating film 804, a silicon nitride film is formed with a thickness of 50 nm and a silicon oxynitride film (SiON (O>N)) is formed thereover.

Then, a first semiconductor film 805 and an n-type second semiconductor film 806 are deposited. The first semiconductor film 805 is formed of an amorphous silicon film with a thickness of 150 nm. Then, after removing an oxide film over the surface of the amorphous silicon film, a semi-amorphous silicon film is formed in a similar manner with a thickness of 50 nm to be used as the second semiconductor film 806. Here, the first semiconductor film and the second semiconductor film are deposited by CVD.

Then, after removing an oxide film formed over the surface of the second semiconductor film 806, the second semiconductor film 806 is partially irradiated with a laser beam 807 using a laser beam direct drawing system, thereby a silicon oxide film 811 is formed over the surface of the second semiconductor film as shown in FIG. 8B.

Then, as shown in FIG. 8C, the second semiconductor film 806 is etched using the silicon oxide film 811 to form a first semiconductor layer 812. Similarly, the first semiconductor film is etched to form a second semiconductor layer 813. Here, the first semiconductor film and the second semiconductor film are etched using a mixed gas of $CF_4$ and $O_2$ with a flow rate of $CF_4:O_2=1:9$. After that, the silicon oxide film 811 is peeled off.

Then, as shown in FIG. 9A, second conductive layers 821 and 822 are formed by a droplet discharge method. The second conductive layers 821 and 822 function as a source line (source electrode) and a drain electrode respectively later. Here, the second conducive layers 821 and 822 are formed by discharging a composition dispersed with Ag (silver) particles, and baking it at 200° C. for 30 minutes.

Note that instead of the aforementioned steps, the second conductive layers 821 and 822 may be formed by using a mask, which is formed by discharging a conductive layer over the first semiconductor layer by a droplet discharge method and baking it, followed by coating or discharging a photosensitive material over the conductive layer and baking it, which is then partially exposed to a laser beam emitted from a laser beam direct drawing system and developed. In this case, a mask having a fine structure can be formed, thereby the distance between the source line (source electrode) and the drain electrode can be shortened.

Then, the first semiconductor layer is etched using the second conductive layers 821 and 822 as masks to form second semiconductor layers 823, 824 and a fourth semiconductor layer 825. Third semiconductor layers 823 and 824 function as a source region and a drain region respectively or contact layers. At this time, the second semiconductor layer is also etched. The fourth semiconductor layer 825 which corresponds to the etched second semiconductor layer functions as a channel region.

Then, as shown in FIG. 9B, a third conductive layer 831 functioning as a pixel electrode is formed over the second conductive layer 822. As a typical example of the material for the third conductive layer 831, a light-transmissive conductive film or a reflective conductive film can be used. As the material for the light-transmissive conductive film, there are indium tin oxide (ITO), zinc oxide (ZnO), indium zinc oxide (IZO), gallium-doped zinc oxide (GZO), indium tin oxide containing silicon oxide, and the like. In addition, as the material for the reflective conductive film, there are metals such as aluminum (Al), titanium (Ti), silver (Ag) and tantalum (Ta), a metal material containing such metals and nitrogen at a concentration of the stoichiometric composition ratio or lower, or nitride of such metals such as aluminum nitride, titanium nitride and tantalum nitride. As the method for forming the third conductive layer 831, sputtering, vapor deposition, CVD, coating, or the like is appropriately used. Here, the third conductive layer 831 is formed by a droplet discharge method using indium tin oxide (ITO) containing silicon oxide to have a thickness of 110 nm.

Through the aforementioned steps, an active matrix substrate can be formed. Note that FIG. 11 is to be referred to in parallel, which illustrates a top structure corresponding to the cross-sectional structure along lines A-B and C-D of FIG. 9B.

Next, a protective film 832 is formed as shown in FIG. 9B. As the protective film 832, a silicon oxide film is formed by sputtering using a silicon target and a sputtering gas of argon and oxygen (flow rate of Ar:$O_2$=1:1) to have a thickness of 100 nm, and then a nitride silicon film is formed thereover by sputtering using a sputtering gas of argon and nitrogen (flow rate of Ar: $N_2$=1:1) to have a thickness of 100 nm.

Then, an insulating film is formed covering the protective film 832 by printing or spin coating, and rubbed to form an alignment film 833. The alignment film 833 can be formed by oblique vapor deposition as well.

Then, as shown in FIG. 10A, a sealant 871 is formed in closed loop in the peripheral region of a pixel portion by a droplet discharge method on a counter substrate 881, over which the alignment film 883 and a second pixel electrode (counter electrode) 882 are formed. The sealant 871 may be mixed with a filler, and the counter substrate 881 may be additionally provided with a color filter or a shielding film (black matrix).

Then, a liquid crystal material is dropped into the closed loop formed by the sealant 871 using a dispenser method (one drop filling method), and the counter substrate 881 over which the alignment film 883 and the second pixel electrode (counter electrode) 882 are formed is attached to the active matrix substrate, followed by ultraviolet curing. Thus, a liquid crystal layer 884 filled with the liquid crystal material is formed. Note that as an alternative method to the droplet discharge method for forming the liquid crystal layer 884, a dip method (soak method) can be used, in which liquid crystals are injected by utilizing a capillary action after attaching the counter substrate to the active matrix substrate.

Then, the protective film 832 and the gate insulating film 804 at a connecting terminal portion of a gate line and a source line are partially removed to expose the connecting terminal of the gate line and the source line.

Then, as shown in FIG. 10B, a wiring board, typically an FPC (Flexible Printed Circuit) (a wiring board 886 connected to the third conductive layer functioning as a gate line) is attached through a connecting conductive layer 885. Further, a connecting portion of the wiring board and the connecting terminal is preferably sealed with a sealing resin. With such a structure, it can be prevented that moisture from the sectional portion enters inside, which would otherwise cause degradation.

Through the aforementioned steps, a liquid crystal display panel can be formed. Note that an electrostatic discharge protection circuit, typically a diode may be provided between the connecting terminal and a source wiring layer (gate wiring layer) or in the pixel portion. In this case, by manufacturing the diode through similar steps to the aforementioned TFT and connecting the gate wiring layer of the pixel portion to a drain or source wiring layer of the diode, electrostatic discharge damage can be prevented.

Note that any of Embodiment Modes 1 to 7 can be applied to this embodiment.

Embodiment 2

Figure 12A:
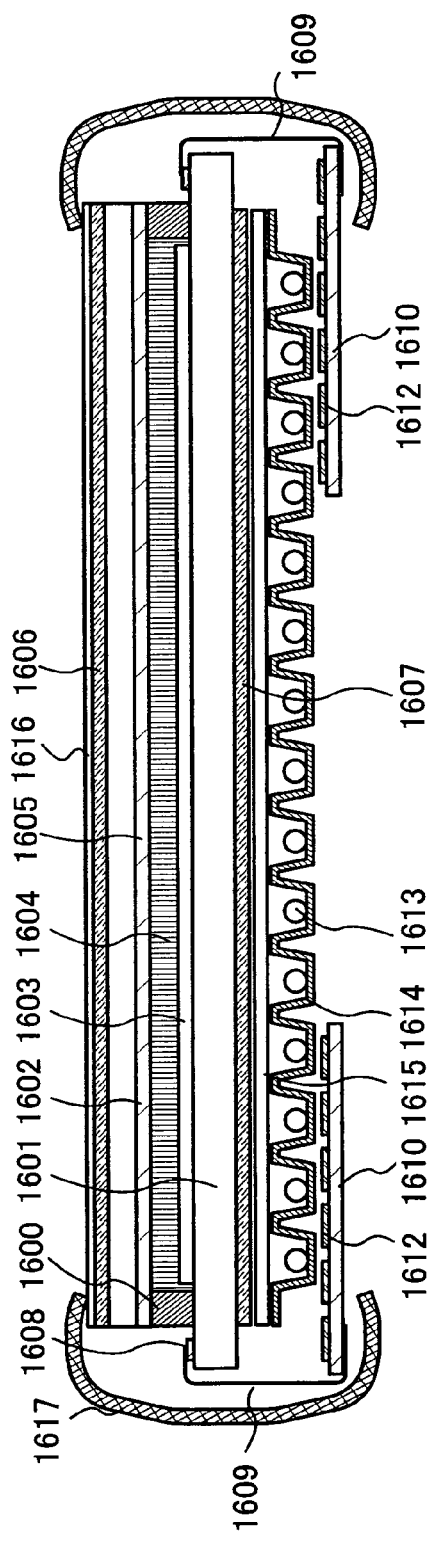
FIGS. 12A and 12B are cross-sectional views each illustrating a structure of a liquid crystal display module in accordance with the invention.

FIG. 12A illustrates a cross-sectional view of a liquid crystal module for displaying color images using white light and a color filter, which is in any of a TN (Twisted Nematic) mode, an IPS (In-Plane-Switching) mode, an MVA (Multi-domain Vertical Alignment) mode, an ASM (Axial Symmetric alignment Micro-cell) mode, and an OCB (Optical Compensated Bend) mode.

As shown in FIG. 12A, an active matrix substrate 1601 is attached to a counter substrate 1602 with a sealant 1600. Between these substrates, a pixel portion 1603 and a liquid crystal layer 1604 are provided to form a display region.

A colored layer 1605 is required for displaying color images, and in the case of an RGB method, colored layers corresponding to the respective colors of red, green and blue are provided correspondingly to the respective pixels. Outside the active matrix substrate 1601 and the counter substrate 1602, polarizing plates 1607 and 1606 are disposed respectively. The surface of the polarizing plate 1606 is formed with a protective layer 1616 to alleviate external shocks.

A connecting terminal 1608 provided on the active matrix substrate 1601 is connected to a wiring board 1610 through an FPC 1609. The wiring board 1610 is incorporated with an external circuit 1612 such as a pixel driver circuit (e.g., an IC chip or a driver IC), a control circuit and a power supply circuit.

A cold-cathode tube 1613, a reflecting plate 1614, an optical film 1615 and an inverter (not shown) constitute a back light unit. With such a light source, light is projected on the liquid crystal panel. The liquid crystal panel, the light source, the wiring board, the FPC and the like are maintained and protected by a bezel 1617.

Figure 12B:
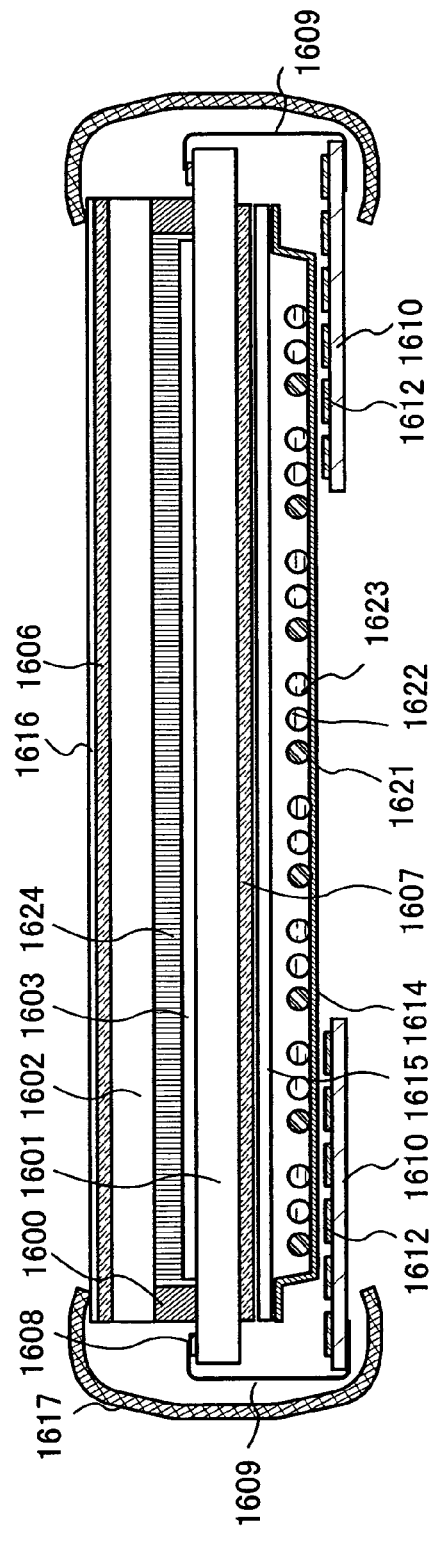

FIG. 12B is a cross-sectional view of a liquid crystal module capable of displaying color images by using a cold-cathode tube or a diode which emits R (Red), G (Green) and B (Blue) light without using a color filter like a field sequential mode, and by composing images by a time-division method. In comparison with FIG. 12A, the liquid crystal module has no color filter. On the reflecting plate 1614, cold-cathode tubes 1621 to 1623 for emitting R (Red), G (Green) and B (Blue) light respectively are provided. In addition, a controller (not shown) for controlling the emission of such cold-cathode tubes is provided. Further, a liquid crystal layer 1624 is filled with ferroelectric liquid crystals, and thus is capable of high-speed operation; therefore, images can be composed by the time-division method.

Note that images can be composed by the time-division method by using such liquid crystal alignment as an OCB mode.

Embodiment 3

Figure 15:
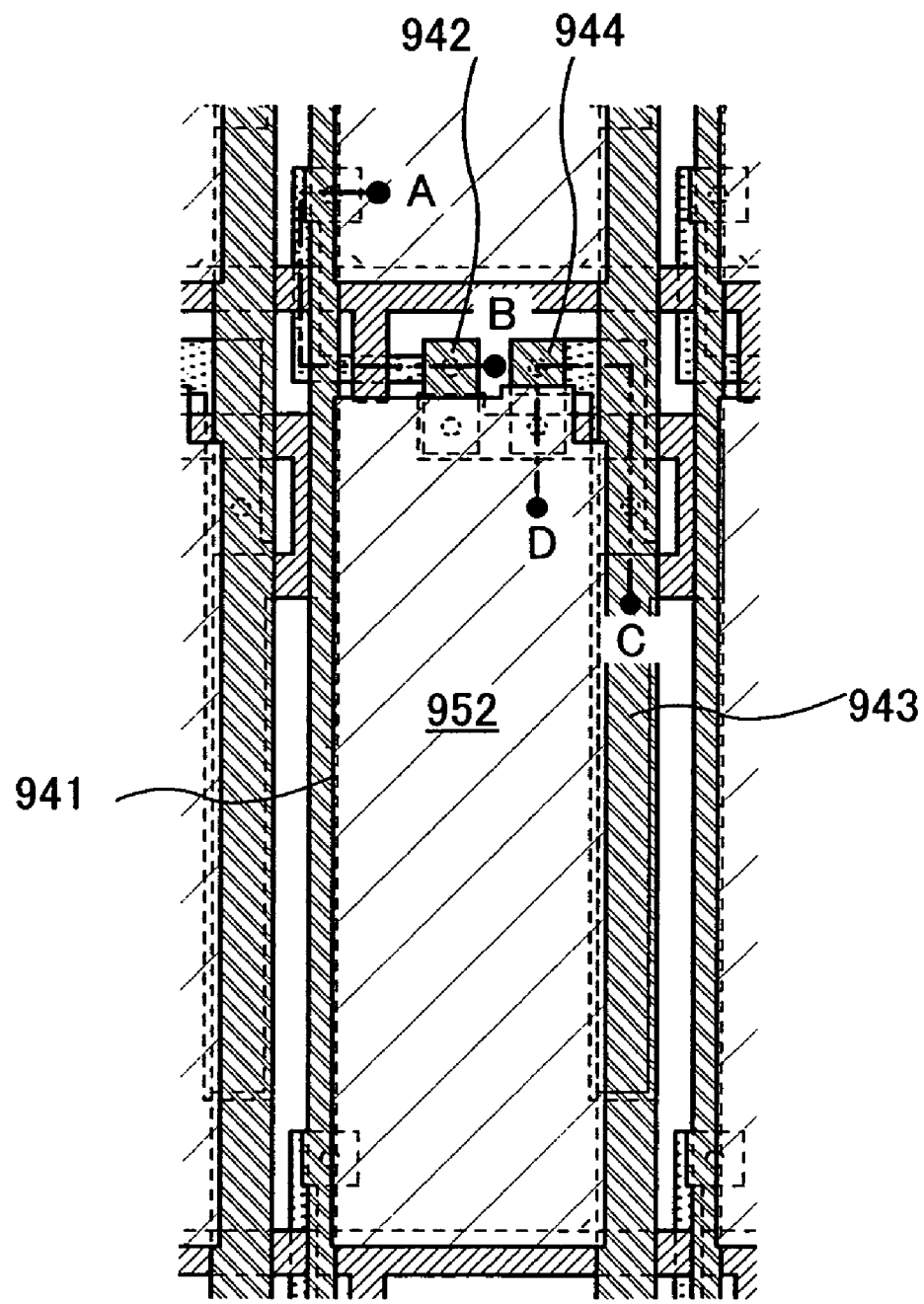
FIG. 15 is a top view illustrating manufacturing steps of a semiconductor device in accordance with the invention.

In this embodiment, description is made with reference to FIGS. 13A to 15 on a method for manufacturing a light-emitting display panel as a typical example of a display panel. FIG. 15 illustrates a top structure of a pixel portion while FIGS. 13A to 14B schematically illustrate cross-sectional structures of the pixel portion in FIG. 15 along lines A-B (switching TFT) and C-D (driving TFT).

Figure 13A:
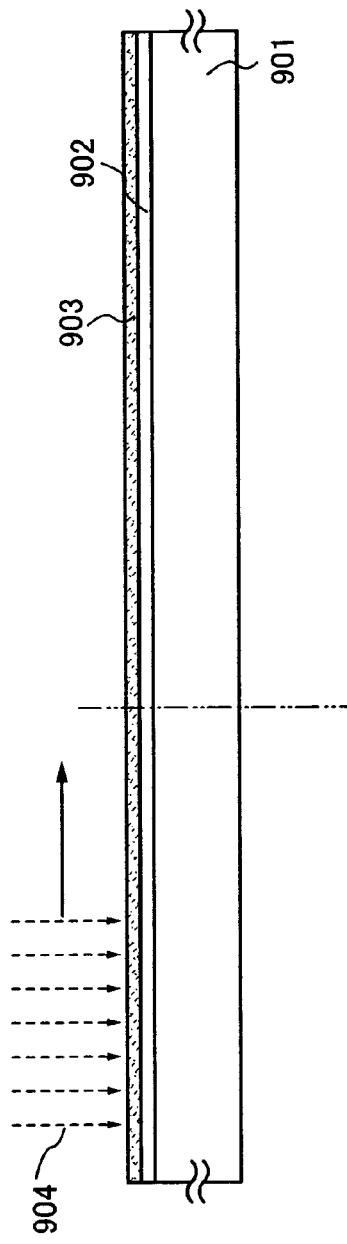
FIGS. 13A to 13C are cross-sectional views illustrating manufacturing steps of a semiconductor device in accordance with the invention.

As shown in FIG. 13A, a first insulating layer 902 is formed over a substrate 901 with a thickness of 100 to 1000 nm. Here, as the first insulating layer, a silicon nitride oxide film is formed by plasma CVD with a thickness of 100 nm, and a silicon oxynitride film is stacked thereover by CVD with a thickness of 50 nm.

Figure 13B:
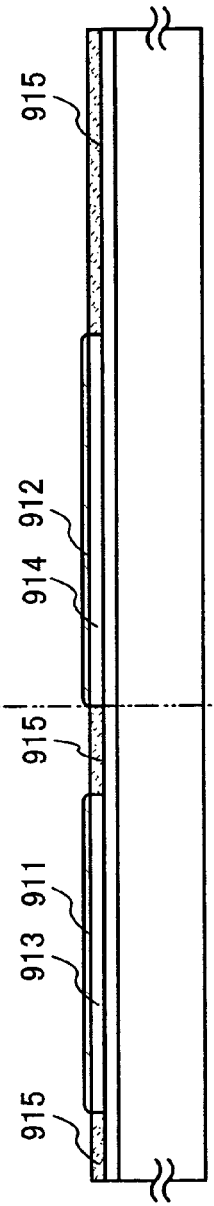

Next, an amorphous semiconductor film 903 is formed with a thickness of 10 to 100 nm. Here, an amorphous silicon film 903 is formed by low-pressure thermal CVD with a thickness of 50 nm. Then, an oxide film formed over the surface of the amorphous semiconductor film is removed, and the amorphous semiconductor film is partially irradiated with a laser beam 904 using a laser beam direct drawing system to form silicon oxide films 911 and 912 as shown in FIG. 13B. At this time, a part of the amorphous semiconductor film which is irradiated with the laser beam is fused, and then cooled to be crystallized. The crystallized semiconductor layers are denoted by 913 and 914, and an amorphous semiconductor layer remaining on the periphery of the crystallized semiconductor layers is denoted by 915.

Figure 13C:
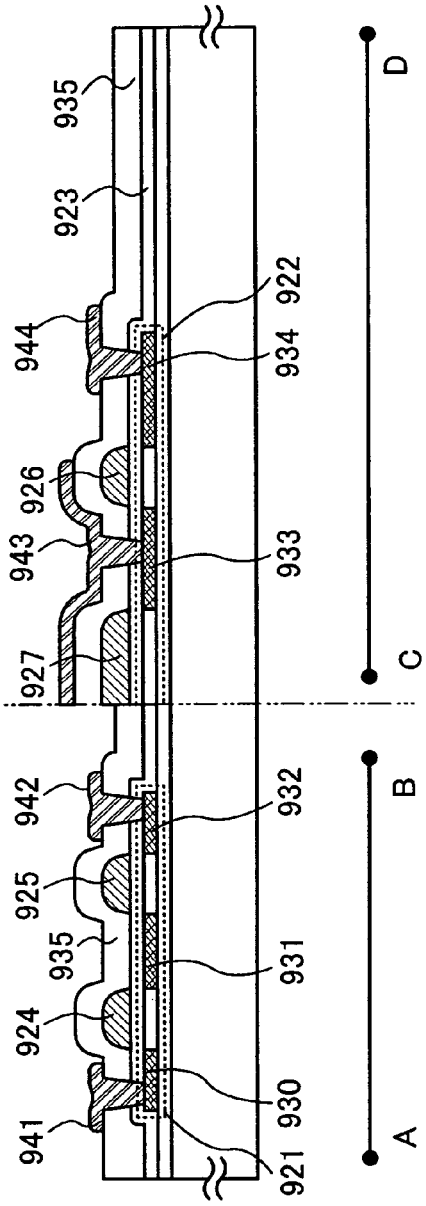

Next, using the silicon oxide films 911 and 912 as masks, the amorphous semiconductor layer 915 is etched to form crystalline semiconductor layers 921 and 922 as shown in FIG. 13C. Then, a second insulating layer 923 functioning as a gate insulating film is formed. Here, a silicon oxide film is deposited by CVD.

Then, a channel doping step is performed over the entire surface or selectively, in which p-type or n-type impurity elements are doped at a low concentration into a region to become a channel region of the TFT. This channel doping step is performed for controlling the threshold voltage of the TFT. Note that, boron is doped here by ion-doping diborane ($B_2H_6$) which is excited by plasma without being separated in mass. Note also that ion implantation in which mass separation is carried out may be used as well.

Then, first conductive layers 924 to 926 functioning as gate electrodes and a first conductive layer 927 functioning as a capacitor wiring are formed. Here, the first conductive layers 924 to 927 are formed by discharging an Ag paste using a droplet discharge method, irradiating it with a laser beam, and baking it.

Then, using the first conductive layers 924 to 937 as masks, phosphorus is doped into the semiconductor layers in a self-aligned manner to form high-concentration impurity regions 930 to 934. The phosphorus concentration in the high-concentration impurity regions is controlled to be in the range of $1 \times 10^{20}$ to $1 \times 10^{21}$ atoms/cm$^3$ (typically, $2 \times 10^{20}$ to $5 \times 10^{20}$ atoms/cm$^3$). Note that the crystalline semiconductor layers 921 and 922 of the region overlapping the first conductive layers 924 to 927 become channel formation regions.

Then, a third insulating layer 935 is formed for covering the first conductive layers 924 to 927. Here, an insulating film containing hydrogen is deposited. After that, the impurity elements doped in the semiconductor layers are activated and hydrogenated. The insulating film containing hydrogen is formed using a silicon nitride oxide film (SiNO film) which is obtained by sputtering.

Then, after forming openings to reach the semiconductor layers, second conductive layers 941 to 944 are formed. The second conductive layer 941 functions as a source line, the second conductive layer 942 functions as a first connecting wiring, the second conductive layer 943 functions as a power supply line and a capacitor wiring, and the second wiring 944 functions as a second connecting wiring. In this embodiment, a three-layer structure is adopted, in which a molybdenum film, an aluminum-silicon alloy film and a molybdenum film are sequentially stacked by sputtering, and then etched into a desired shape to form a third conductive layer.

Then, as shown in FIG. 14A, a fourth insulating layer 951 is formed. The fourth insulating layer is preferably formed of an insulating layer which can be planarized. The insulating layer which can be planarized can be formed by appropriately using a similar material and manufacturing method to the fourth insulating layer 544 shown in Embodiment Mode 7. Here, an acrylic resin is deposited. Note that by forming the fourth insulating layer 951 using an organic material dissolved with or dispersed with a material which absorbs visible light such as a black colorant and pigment, stray light of a light-emitting element to be formed later can be absorbed in the fourth insulating layer, thereby contrast of each pixel can be improved.

Then, an opening is formed in the fourth insulating layer by known photolithography and etching so that the second conductive layer (second connecting wiring) 944 is partially exposed. Then, a third conductive layer 952 is formed. The third conductive layer functions as a first pixel electrode. As the third conductive layer 952, a reflecting film and a light-transmissive conductive film are stacked. Here, an aluminum film containing 1 to 20% of nickel and ITO containing silicon oxide are stacked by sputtering. Note that aluminum containing 1 to 20% of nickel is preferably used since it does not cause electric corrosion even when it is in contact with the ITO as the oxide. After that, the reflective film and the light-transmissive conductive film are partially etched to form the third conductive layer 952.

Note that FIG. 15 is to be referred to in parallel, which illustrates a top structure corresponding to the cross-sectional structure along lines A-B and C-D of FIG. 14A.

Then, a fifth insulating layer 961 to be a partition wall (also referred to as a bank or the like) is formed covering an edge of the third conductive layer 952. The fifth insulating layer is formed using a photosensitive or non-photosensitive organic material (e.g., polyimide, acrylic, polyamide, polyimide amide, resist or benzocyclobutene) or an SOG film (e.g., a $SiO_x$ film containing an alkyl group) in the thickness range of 0.8 to 1 μm. When the fifth insulating layer is formed using a photosensitive material, the side face thereof has a continuously variable curvature radius, which is preferable in that a thin film of the upper layer can be formed without breaking.

Alternatively, the fifth insulating layer may be formed using a light-shielding insulator obtained by dissolving or dispersing a material which absorbs visible light such as a pigment and a black colorant into the aforementioned organic material. In such a case, the fifth insulating layer functions as a black matrix; therefore, it can absorb the stray light from the light-emitting element to be formed later. As a result, contrast of each pixel is improved. Further, if the fourth insulating layer 951 is also formed of a light-shielding insulator, a double light-shielding effect can be obtained in combination with the fifth insulating layer 961.

Next; a layer 962 containing a light-emitting substance is formed over the surface of the third conductive layer 952 and the edge of the fifth insulating layer 961 by vapor deposition, coating or droplet discharge method. After that, a fourth conductive layer 963 which functions as a second pixel electrode is formed over the layer 962 containing a light-emitting substance. Here, ITO containing silicon oxide is deposited by sputtering. As a result, a light-emitting element can be formed by the third conductive layer, the layer containing a light-emitting substance and the fourth conducive layer. Each material for the conductive layers and the layer containing a light-emitting substance which constitute the light-emitting element is appropriately selected, and the thickness thereof is also controlled.

Note that before forming the layer 962 containing a light-emitting substance, heat treatment is performed at 200° C. in the atmospheric pressure to remove moisture absorbed inside or the surface of the fifth insulating layer 961. It is preferable that the heat treatment be applied at 200 to 400° C., or more preferably at 250 to 350° C. under the low pressure, followed by the formation of the layer 962 containing a light-emitting substance by vacuum vapor deposition without being exposed to the atmospheric air, or a droplet discharge method under the low pressure.

A light-emitting element formed of the aforementioned materials emits light when it is applied a forward bias. A pixel of a display device formed using such a light-emitting element can be driven by a passive matrix method or an active matrix method. In either case, each pixel is controlled to emit light by being applied a forward bias at a specific timing whereas the pixel is in the non-emission state for a certain period of time. By applying a reverse bias in the non-emission period, reliability of the light-emitting element can be improved. As a degradation mode of the light-emitting element, there is a degradation that the luminance intensity is decreased under a constant drive condition, or a degradation that apparent luminance is decreased due to the non-emission region being increased in the pixels. For this, by performing AC drive in which a forward or reverse bias is applied, degradation speed can be decreased, resulting in improvement of the reliability of the light-emitting device.

Next, a light-transmissive protective layer 964 for blocking out the moisture is formed covering the light-emitting element. The light-transmissive protective layer 964 may be formed of a silicon nitride film, a silicon oxide film, a silicon oxynitride film (e.g., a SiNO film (composition ratio: N>O) or a SiON film (composition ratio: N<O)), a thin film containing carbon as a main component (e.g., a DLC film or a CN film) or the like which is formed by sputtering or CVD.

Through the aforementioned steps, a light-emitting display panel can be manufactured. Note that an electrostatic discharge protection circuit, typically a diode may be provided between the connecting terminal and a source wiring layer (gate wiring layer) or in a pixel portion. In this case, by manufacturing the diode through similar steps to the aforementioned TFT, and connecting the gate wiring layer of the pixel portion to a drain or source wiring layer of the diode, electrostatic discharge damage can be prevented.

Embodiment 4

Description is made with reference to FIGS. 16A to 16F on a mode of a light-emitting element applicable to the aforementioned embodiments.

Figure 16A:
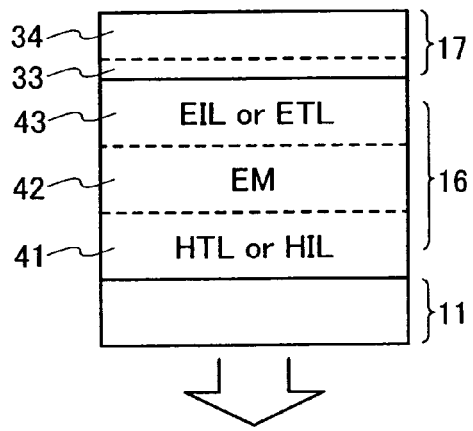
FIGS. 16A to 16F are cross-sectional diagrams each illustrating a mode of a light-emitting element applicable to the invention.

FIG. 16A illustrates an example in which a first pixel electrode 11 is formed of a light-transmissive conductive oxide material containing silicon oxide at a concentration of 1 to 15 atomic %. Over the pixel electrode 11, a layer 16 containing a light-emitting substance is formed, which has stacked layers of a hole-transporting layer (HTL) or hole-injection layer (HIL) 41, a light-emitting layer (EM) 42, and an electron-injection layer (EIL) or electron-transporting layer (ETL) 43. Over the layer 16, a second pixel electrode 17 is formed, which has stacked layers of a first electrode layer 33 containing an alkaline metal such as LiF and MgAg or an alkaline earth metal, and a second electrode layer 34 formed of a metal material such as aluminum. This pixel structure allows light to be emitted from the first pixel electrode 11 side as shown in the arrow in the drawing.

Figure 16B:
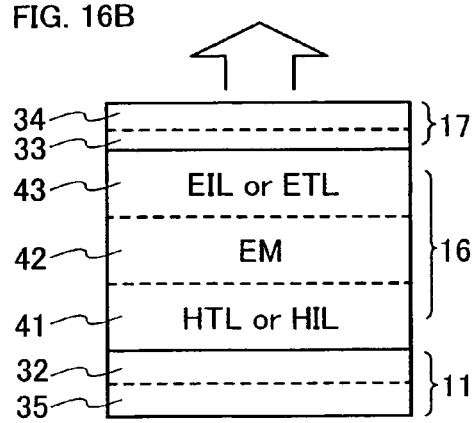

FIG. 16B illustrates an example in which light is emitted from the second pixel electrode 17, and the first pixel electrode 11 has stacked layers of a first electrode layer 35 formed of a metal such as aluminum and titanium or a metal material containing such metal and nitrogen at the stoichiometric composition ratio or lower, and a second electrode layer 32 formed of a conductive oxide material containing silicon oxide at a concentration of 1 to 15 atomic %. Over the first pixel electrode 11, the layer 16 containing a light-emitting substance is formed, which has stacked layers of the hole-transporting layer or hole-injection layer 41, the light-emitting layer 42, and the electron-injection or electron-transporting layer 43. Over the layer 16, the second pixel electrode 17 is formed, which has stacked layers of the third electrode layer 33 containing an alkaline metal such as LiF and CaF or an alkaline earth metal, and the fourth electrode layer 34 formed of a metal material such as aluminum. By forming each layer to have a thickness of 100 nm or less to transmit light, light can be emitted from the second pixel electrode 17.

Figure 16C:
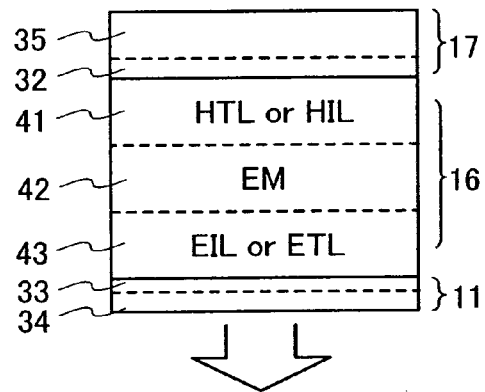
Figure 16D:
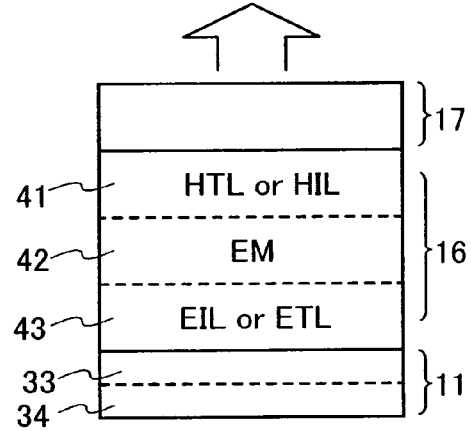
Figure 16E:
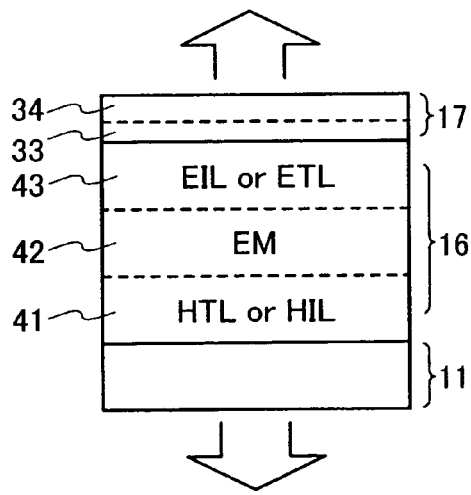

FIG. 16E illustrates an example in which light is emitted in both directions, namely from the first electrode and the second electrode. The first pixel electrode 11 is formed of a light-transmissive conductive film having a high work function while the second pixel electrode 17 is formed of a light-transmissive conductive film having a low work function. Typically, the first pixel electrode 11 may be formed of a conductive oxide material containing silicon oxide at a concentration of 1 to 15 atomic % while the second pixel electrode 17 may be formed to have the third electrode layer 33 containing an alkaline metal such as LiF and CaF or an alkaline earth metal, and the fourth electrode layer 34 containing a metal material such as aluminum, each of which has a thickness of 100 nm or less. Over the first pixel electrode 11, the layer 16 containing a light-emitting substance is formed, which has stacked layers of the hole-transporting layer or hole-injection layer 41, the light-emitting layer 42, and the electron-injection or electron-transporting layer 43.

FIG. 16C illustrates an example in which light is emitted from the first pixel electrode 11, and the layer 16 containing a light-emitting substance has stacked layers of the electron-injection layer or electron-transporting layer 43, the light-emitting layer 42, and the hole-transporting layer or hole-injection layer 41 in this order. Over the layer 16 containing a light-emitting substance, the second pixel electrode 17 is formed, which has stacked layers of the second electrode layer 32 formed of a conducive oxide material containing silicon oxide at a concentration of 1 to 15 atomic %, and the first electrode layer 35 formed of a metal such as aluminum and titanium or a metal material containing such metal and nitrogen at a concentration of the stoichiometric composition ratio or lower. The first pixel electrode 11 has stacked layers of the third electrode layer 33 containing an alkaline metal such as LiF and CaF or an alkaline earth metal, and the fourth electrode layer 34 formed of a metal material such as aluminum. By forming each layer to have a thickness of 100 nm or less to transmit light, light can be emitted from the first pixel electrode 11.

FIG. 16D illustrates an example in which light is emitted from the second pixel electrode 17, and the layer 16 containing a light-emitting substance has stacked layers of the electron-injection layer or electron-transporting layer 43, the light-emitting layer 42, and the hole-transporting layer or hole-injection layer 41 in this order. The first pixel electrode 11 has a similar structure of the second pixel electrode 17 in FIG. 16A, and is formed thick enough to reflect light which is emitted from the layer containing a light-emitting substance. The second pixel electrode 17 is formed of a conductive oxide material containing silicon oxide at a concentration of 1 to 15 atomic %. In such a structure, when the hole-transporting layer or hole-injection layer 41 is formed of a metal oxide as an inorganic substance (typically, molybdenum oxide or vanadium oxide) oxygen which is introduced during the formation of the second pixel electrode layer is supplied, the hole-injection property can be improved while decreasing a drive voltage.

Figure 16F:
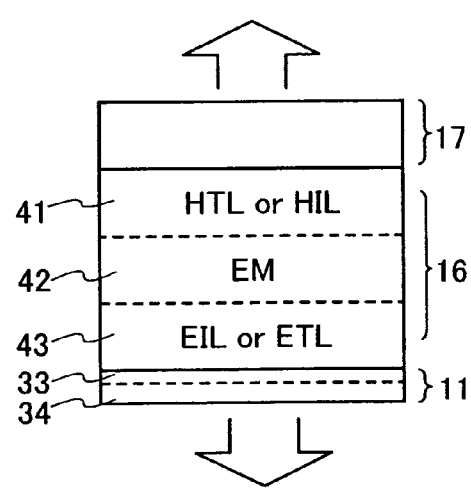

FIG. 16F illustrates an example in which light is emitted from both directions, namely from the first pixel electrode and the second pixel electrode. The first pixel electrode 11 is formed of a light-transmissive conductive film having a low work function while the second pixel electrode 17 is formed of a light-transmissive conductive film having a high work function. Typically, the first pixel electrode 11 may be formed to have the third electrode layer 33 containing an alkaline metal such as LiF and CaF or an alkaline earth metal, and the fourth electrode layer 34 formed of a metal material such as aluminum, each of which is not thicker than 100 nm while the second pixel electrode 17 may be formed of a conductive oxide material containing silicon oxide at a concentration of 1 to 15 atomic %. Over the first pixel electrode 11, the layer 16 containing a light-emitting substance has stacked layers of the electron-injection layer or electron-transporting layer 43, the light-emitting layer 42, and the hole-transporting layer or hole-injection layer 41 are formed in this order.

Embodiment Mode 5

Description is made with reference to FIGS. 17A to 17F on a pixel circuit of the light-emitting display panel shown in the aforementioned embodiments and the operation thereof. As an operation structure of a light-emitting display panel having an input of a digital video signal, there is the one in which a voltage is inputted as a video signal to a pixel and the one in which a current is inputted as a video signal to a pixel. The display device having a video signal input of a voltage includes the one in which a voltage applied to a light-emitting element is constant (CVCV) and the one in which a current applied to a light-emitting element is constant (CVCC). In addition, the display device having a video signal input of a current includes the one in which a constant voltage is applied to a light-emitting element (CCCV) and the one in which a constant current is applied to a light-emitting element (CCCC). In this embodiment mode, description is made with reference to FIGS. 17A and 17B on the pixel driven with the CVCV operation. In addition, FIGS. 17C to 17F illustrate pixels driven with the CVCC operation.

Figure 17A:
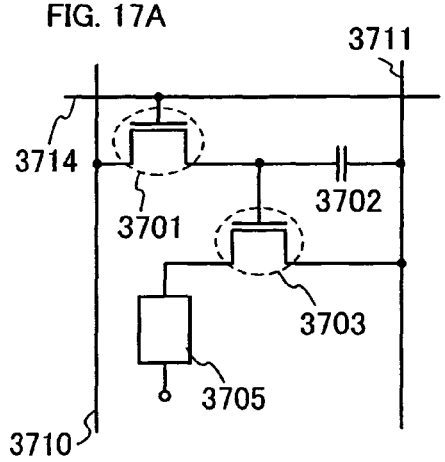
FIGS. 17A to 17F are diagrams each illustrating a circuit having a light-emitting element applicable to the invention.
Figure 17B:
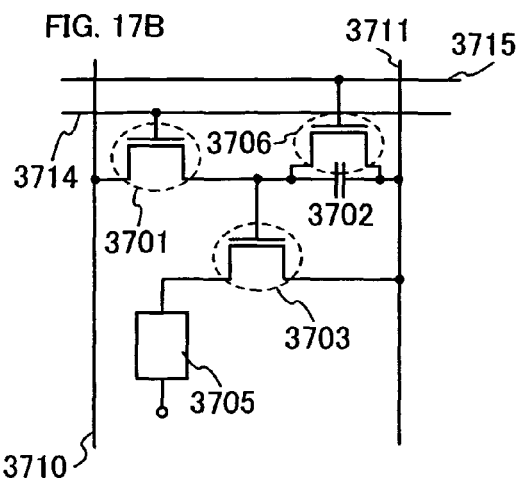

In the pixels shown in FIGS. 17A and 17B, a source line 3710 and a power supply line 3711 are disposed in columns, and a gate line 3714 is disposed in rows. In addition, the pixel includes a switching TFT 3701, a driving TFT 3703, a capacitor 3702 and a light-emitting element 3705.

Note that the switching TFT 3701 and the driving TFT 3703 operate in the linear region when they are on, and the driving TFT 3703 functions to control whether to apply a voltage or not to the light-emitting element 3705. Both the TFTs preferably have the same conductivity in view of the manufacturing steps, and in this embodiment mode, p-channel TFTs are employed. In addition, the driving TFT 3703 may be either an enhancement mode TFT or a depletion mode TFT. The ratio (W/L) of the channel width W to the channel length L of the driving TFT 3703 is preferably 1 to 1000 though it depends on the mobility of the TFT. As the W/L is higher, the electric property of the TFT can be further improved.

In the pixels shown in FIGS. 17A to 17B, the switching TFT 3701 controls a video signal input to each pixel. When the switching TFT 3701 is turned on, a video signal is inputted to the pixel. Then, a voltage of the video signal is held in the capacitor 3702.

In FIG. 17A, when the power supply line 3711 is at Vss while a counter electrode of the light-emitting element 3705 is at Vdd, namely in the case of FIGS. 16C and 16D, a counter electrode of the light-emitting element is an anode while an electrode thereof connected to the driving TFT 3703 is a cathode. In this case, luminance unevenness caused by the characteristic variations of the driving TFT 3703 can be suppressed.

In FIG. 17A, when the power supply line 3711 is at Vdd while the counter electrode of the light-emitting element 3705 is at Vss, namely in the case of FIGS. 16A and 16B, the counter electrode of the light-emitting element is a cathode while the electrode thereof connected to the driving TFT 3703 is an anode. In this case, by inputting a video signal having a higher voltage than Vdd to the source line 3710, the voltage of the video signal is held in the capacitor 3702, and the driving TFT 3703 operates in the linear region. Therefore, luminance unevenness caused by the variations of TFTs can be improved.

The pixels shown in FIG. 17B has basically the same pixel configuration as FIG. 17A except that a TFT 3706 and a gate line 3715 are additionally provided.

The TFT 3706 is controlled to be turned on/off by the gate line 3715 which is provided additionally. When the TFT 3706 is turned on, charges held in the capacitor 3702 are released, thereby the driving TFT 3703 is turned off. That is, the provision of the TFT 3706 can forcibly provide the state where no current flows to the light-emitting element 3705. Therefore, the TFT 3706 can be called an erasing TFT. Thus, in the configuration of FIG. 17B, emission period can start simultaneously with or immediately after a writing period without awaiting the signal input to the whole pixels, which can improve the duty ratio of light emission.

In the pixel having the aforementioned configurations, the current value of the light-emitting element 3705 can be determined by the driving TFT 3703 which operates in the linear region. According to the aforementioned configurations, luminance unevenness of light-emitting elements due to the variations in characteristics of TFTs can be improved, thereby a display device with improved image quality can be provided.

Next, description is made with reference to FIGS. 17C to 17F on the pixel which is driven with the CVCC operation. The pixel shown in FIG. 17C corresponds to the pixel configuration shown in FIG. 17A additionally provided with a power supply line 3712 and a current-controlling TFT 3704.

Figure 17C:
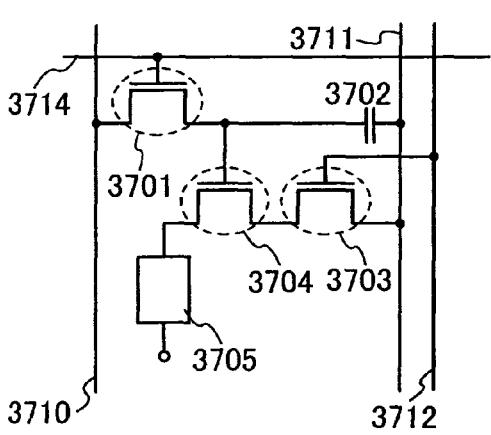
Figure 17D:
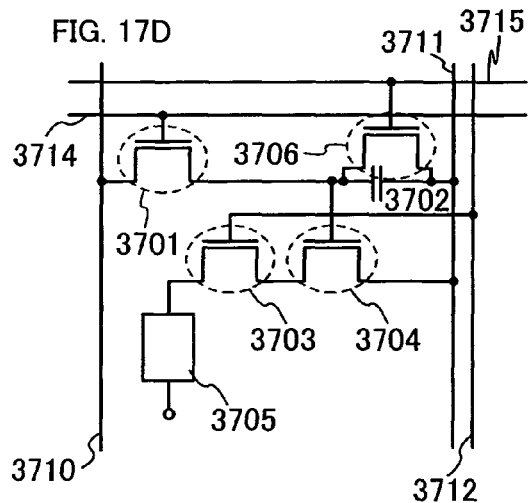
Figure 17E:
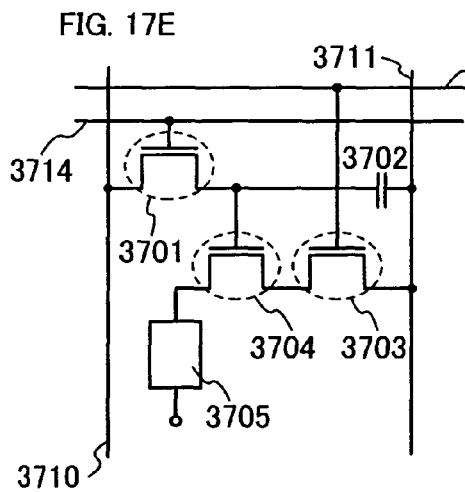

The pixel shown in FIG. 17E has basically the same pixel configuration as FIG. 17C except that the gate electrode of the driving TFT 3703 is connected to the power supply line 3712 disposed in a row direction. That is, the pixels shown in FIGS. 17C and 17E are equivalent circuit diagrams to each other. However, the power supply line 3712 is formed of a conductive film of a different layer in the case where the power supply line 3712 is disposed in a column direction (FIG. 17C) and the case where the power supply line 3712 is disposed in a row direction (FIG. 17E). Here, a wiring connected to the gate electrode of the driving TFT 3703 is considered and description is made separately in FIGS. 17C and 17E in order to show that the respective wirings are manufactured using different layers.

Note that the switching TFT 3701 operates in the linear region while the driving TFT 3703 operates in the saturation region. In addition, the driving TFT 3703 functions to control a current value flowing to the light-emitting element 3705 while the current-controlling TFT 3704 operates in the saturation region and functions to control a current supply to the light-emitting element 3705.

Figure 17F:
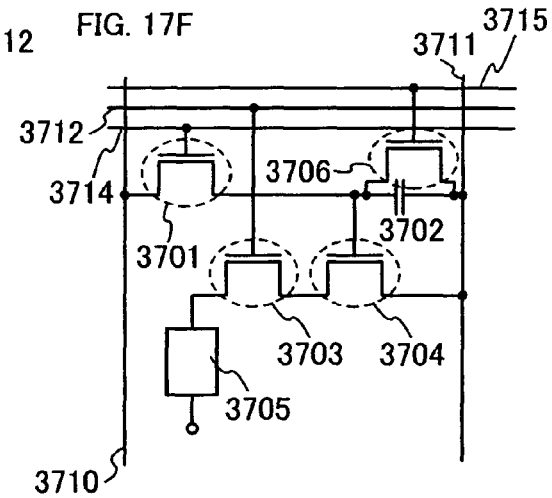

The pixels shown in FIGS. 17D and 17F have basically the same configurations as the pixels shown in FIGS. 17C and 17E respectively except that an erasing TFT 3706 and a gate line 3715 are additionally provided.

Note that the pixels shown in FIGS. 17A and 17B can also perform CVCC operation. In addition, in the pixels having the operation structures shown in FIGS. 17C to 17F, Vdd and Vss can be appropriately changed according to the direction of a current flow in the light-emitting element similarly to FIGS. 17A and 17B.

In the pixels having the aforementioned configurations, the current-controlling TFT 3704 operates in the linear region; therefore, slight fluctuation of Vgs of the current-controlling TFT 3704 does not affect the current value supplied to the light-emitting element 3705. That is, the current value supplied to the light-emitting element 3705 can be determined by the driving TFT 3703 which operates in the saturation region. According to the aforementioned configurations, luminance unevenness of light-emitting elements due to the variations in characteristics of TFTs can be improved, thereby a display device with improved image quality can be provided.

In particular, in the case of forming a thin film transistor having an amorphous semiconductor or the like, the area of a semiconductor film of a driving TFT is preferably large as it can reduce the variations of TFTs. Therefore, the pixels shown in FIGS. 17A and 17B can have a higher aperture ratio as it has a small number of TFTs.

Note that the aforementioned examples show the configurations provided with the capacitor 3702; however, the invention is not limited to this, and the capacitor 3702 may be omitted if the gate capacitance or the like can substitute the capacitor for holding video signals.

Note that in the case where the semiconductor layer of a thin film transistor is formed of an amorphous semiconductor film, the threshold voltage shifts easily; therefore, a circuit for correcting the threshold voltage is preferably provided inside or on the periphery of a pixel.

Such an active matrix light-emitting device is considered advantageous when the pixel density is increased since TFTs are provided in each pixel and a low voltage drive can thus be achieved. On the other hand, a passive matrix light-emitting device in which TFTs are provided in each column can be formed as well. The passive matrix light-emitting device has no TFT in each pixel; therefore, it has high aperture ratio.

In such a light-emitting device of the invention, a driving method for image display is not specifically limited. For example, a dot-sequential driving method, a line-sequential driving method, an area sequential driving method or the like may be employed. Typically, a line-sequential driving method is employed, and a time division gray scale method or an area gray scale driving method may be appropriately employed. In addition, image signals inputted to source lines of the display device may be either analog signals or digital signals. A driver circuit and the like may be designed in accordance with the image signals.

As set forth above, various pixel circuits can be employed.

Embodiment 6

Figure 18A:
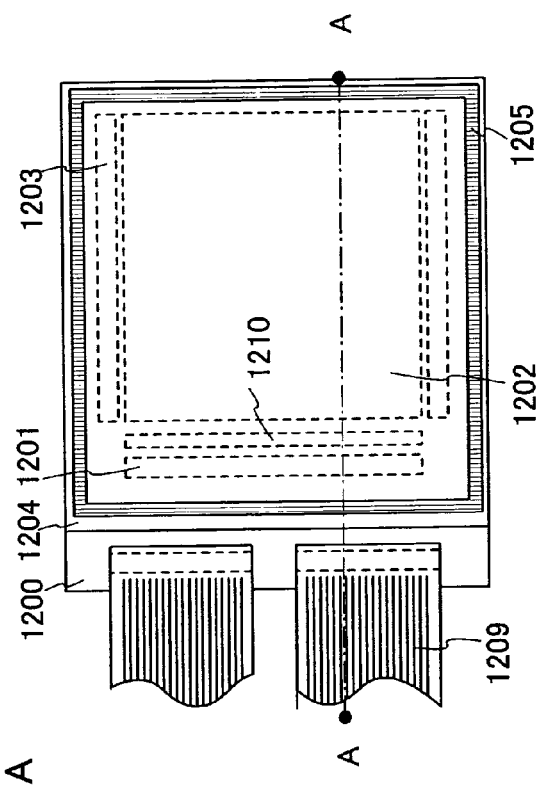
FIG. 18A is a top view illustrating a structure of a light-emitting display panel of the invention and FIG. 18B is a cross-sectional view thereof.
Figure 18B:
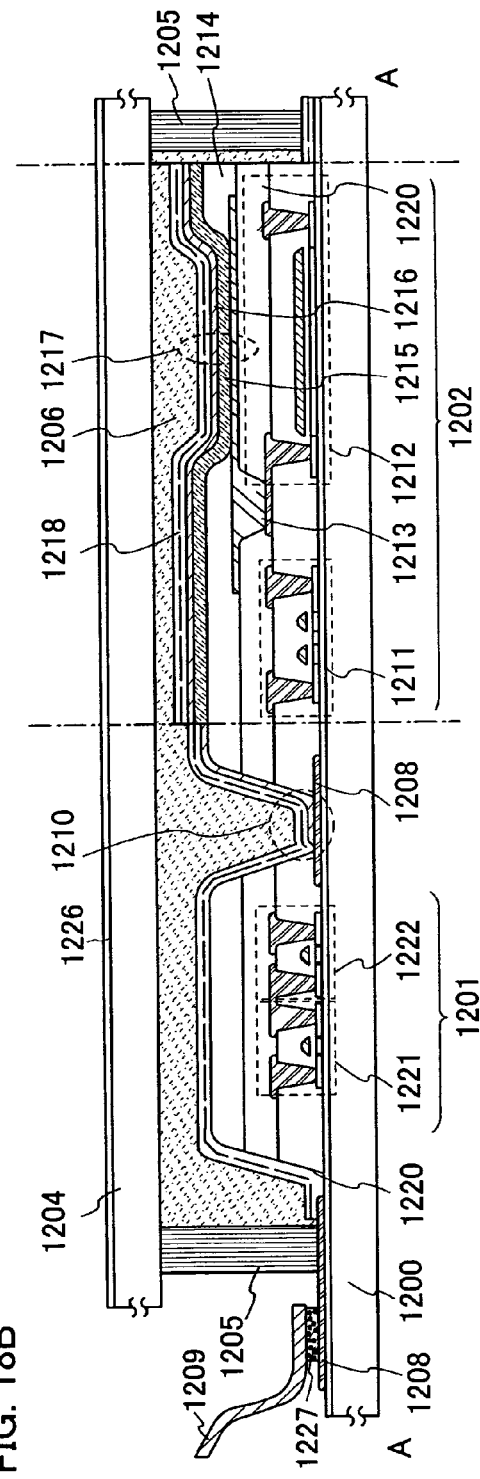

In this embodiment, description is made with reference to FIGS. 18A and 18B on the exterior view of a light-emitting display panel as an example of a display panel. FIG. 18A is a top view of a panel which is obtained by sealing a first substrate and a second substrate with a first sealant 1205 and a second sealant 1206. FIG. 18A is a cross-sectional view thereof along a line A-A' in FIG. 18A.

In FIG. 18A, reference numeral 1201 indicated by a dotted line is a source line driver circuit, 1202 is a pixel portion and 1203 is a gate line driver circuit. In this embodiment, the source line driver circuit 1201, the pixel portion 1202 and the gate line driver circuit 1203 are located in the region sealed with the first sealant and the second sealant. The first sealant is preferably an epoxy resin having high viscosity including a filler. On the other hand, the second sealant is preferably an epoxy resin having low viscosity. In addition, the first sealant 1205 and the second sealant 1206 are desirably materials which do not transmit moisture or oxygen as much as possible.

In addition, a drying agent may be provided between the pixel portion 1202 and the first sealant 1205. Further, a drying agent may be provided over the gate line or the source line in the pixel portion. The drying agent is preferably calcium oxide (CaO), barium oxide (BaO) or a substance which absorbs water ($H_2O$) by chemical absorption such as the oxide of alkaline earth metals. However, the invention is not limited to these, and a substance which absorbs water by physical absorption such as zeolite and silica gel may be used as well.

By providing a drying agent in the region overlapping a gate line or a source line, or fixing a resin having high moisture permeability on the second substrate 1204 in the condition of containing a particulate drying agent, intrusion of moisture into display elements and degradation resulting therefrom can be suppressed without decreasing the aperture ratio. Here, the resin having high moisture permeability includes an organic substance or an inorganic substance such as an acrylic resin, an epoxy rein, siloxane polymers, polyimide, PSG (Phosphor Silicate Glass) and BPSG (Boron Phosphorus Silicon Glass).

Note that reference numeral 1210 denotes a connecting wiring for transmitting signals inputted to the source line driver circuit 1201 and the gate line driver circuit 1203, which receives video signals and clock signals from an FPC (Flexible Printed Circuit) 1209 through a connecting wiring 1208.

Next, description is made with reference to FIG. 18B on the cross-sectional structure. Over a first substrate 1200, a driver circuit and a pixel portion are formed, which include a plurality of semiconductor elements typified by TFTs. The source line driver circuit 1201 as a driver circuit and the pixel portion 1202 are shown here. Note that the source line driver circuit 1201 is constituted by a CMOS circuit including an n-channel TFT 1221 and a p-channel TFT 1222.

In this embodiment, TFTs of the source line driver circuit, the gate line driver circuit and the pixel portion are formed over the same substrate. Therefore, the volume of the light-emitting display panel can be reduced.

The pixel portion 1202 is constituted by a plurality of pixels, each of which includes a switching TFT 1211, a driving TFT 1212 and a first pixel electrode (anode) 1213 formed of a reflective conductive film which is electrically connected to the drain of the driving TFT 1212.

For an interlayer insulating film 1220 of such TFTs 1211, 1212, 1221 and 1222, an inorganic material (e.g., silicon oxide, silicon nitride or silicon oxynitride), an organic material (e.g., polyimide, polyamide, polyimide amide or benzocyclobutene) or a material containing siloxane polymers as a main component can be used.

In addition, an insulator (also called a bank, partition wall or the like) 1214 is formed on opposite ends of the first pixel electrode (anode) 1213. In order to increase the coverage of a film formed on the insulator 1214, the insulator 1214 is formed to have a curved surface having curvature on the top end or the bottom end.

Over the first pixel electrode (anode) 1213, an organic compound material is deposited to selectively form a layer 1215 containing a light-emitting substance. Over the light-emitting layer 1215, a second pixel electrode 1216 is formed.

The layer 1215 containing a light-emitting substance may appropriately adopt the structure shown in Embodiment 4.

In this manner, a light-emitting element 1217 which is constituted by the first pixel electrode (anode) 1213, the layer 1215 containing a light-emitting substance and the second pixel electrode (cathode) 1216 is formed. The light-emitting element 1217 emits light to the second substrate 1204 side.

In addition, a protective stacked layer 1218 is formed in order to seal the light-emitting element 1217. The protective stacked layer 1218 has stacked layers of a first inorganic insulating film, a stress relaxation film and a second inorganic insulating film. Then, the protective stacked layer 1218 is attached to the second substrate 1204 with the first sealant 1205 and the second sealant 1206. Note that the second sealant is preferably dropped using a system for discharging a composition. After dropping or discharging the sealant from a dispenser to be applied on the active matrix substrate, and attaching the second substrate to the active matrix substrate in vacuum, followed by ultraviolet curing, they can be sealed.

The connecting wiring 1208 and the FPC 1209 are electrically connected with an anisotropic conductive film or resin 1227. Further, it is preferable that a connecting portion of each wiring layer and the connecting terminal be sealed with a sealing resin. With such a structure, it can be prevented that the moisture from the cross-sectional portion enters, which would otherwise cause degradation.

Note that the space between the second substrate 1204 and the protective stacked layer 1218 may be filled with an inert gas, for example, a nitrogen gas, in which case the intrusion of moisture and oxygen can be prevented with high efficiency.

In addition, the second substrate 1204 may be provided with a colored layer. In this case, full color display can be performed by providing light-emitting elements capable of white-light emission in the pixel portion and additionally providing colored layers of RGB. Alternatively, full color display can be performed by providing light-emitting elements capable of blue-light emission in the pixel portion and additionally providing a color conversion layer. Further, a light-emitting element which emits red, green or blue light may be formed in each pixel and the colored layer may be used in combination as well. Such a display module has high color purity and thus is capable of displaying high-resolution images.

In addition, the surface of the second substrate 1204 may be provided with a polarizing plate and a retardation plate.

In addition, one or both of the first substrate 1200 and the second substrate 1204 may be formed using a film, a resin or the like to form a light-emitting display panel. By sealing the display panel without using a counter substrate in such a manner, weight saving, downsizing and slimming of the display device can be achieved.

Further, by connecting an external circuit such as a power supply circuit and a controller to the light-emitting display panel, a light-emitting display module can be formed.

Note that any of Embodiment Modes 1 to 7 may be applied to this embodiment.

Heretofore described are examples of a liquid crystal display panel and a light-emitting display panel as a display panel; however, the invention is not limited to these. For example, the invention can be appropriately applied to a display panel or a display module of a DMD (Digital Micromirror Device), PDP (Plasma Display Panel), FED (Field Emission Display) and electrophoretic display device (electronic paper) or the like.

Embodiment 7

Figure 19A:
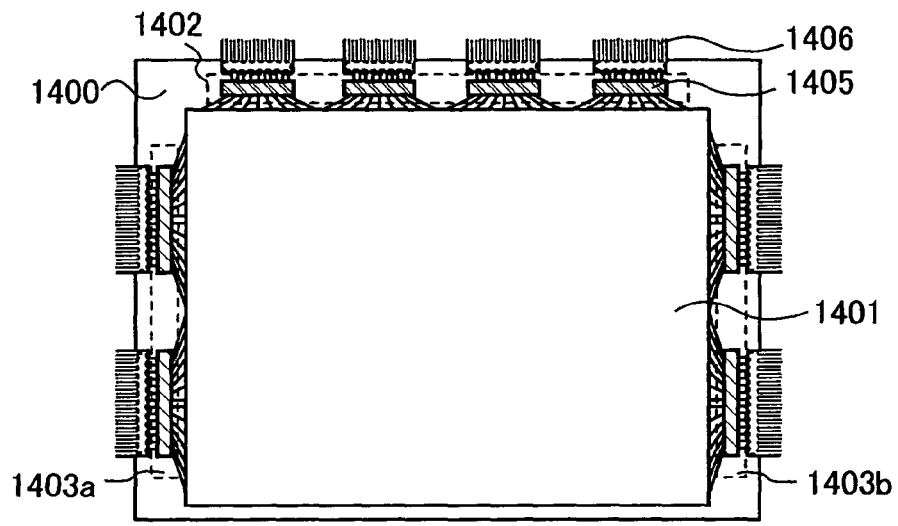
FIGS. 19A to 19C are top views each illustrating a mounting method of a driver circuit on a display panel in accordance with the invention.
Figure 19B:
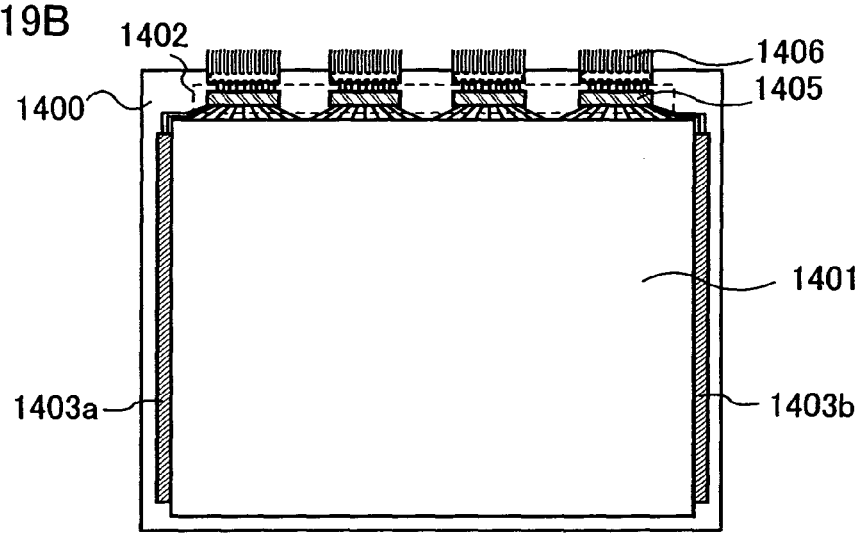
Figure 19C:
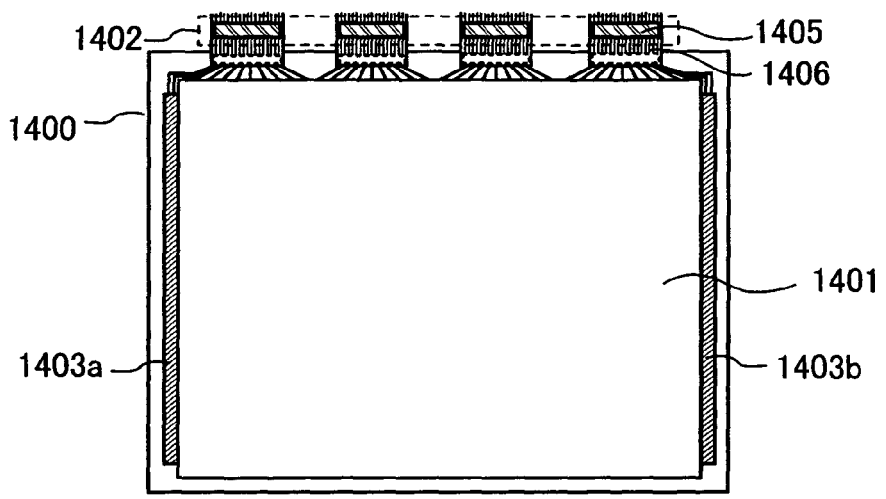

In this embodiment, description is made with reference to FIGS. 19A to 19C on the mounting of a driver circuit on the display panel shown in the aforementioned embodiments.

As shown in FIG. 19A, a source line driver circuit 1402 and gate line driver circuits 1403a and 1403b are mounted on the periphery of a pixel portion 1401. In FIG. 19A, IC chips 1405 are mounted on a substrate 1400 as the source line driver circuit 1402, the gate line driver circuits 1403a and 1403b and the like by a mounting method using a known anisotropic conductive adhesive or an anisotropic conductive film, COG bonding, wire bonding, reflow processing using a solder bump or the like. Here, COG bonding is employed to connect the IC chips to an external circuit through an FPC (Flexible Printed Circuit) 1406.

Note that a part of the source line driver circuit 1402, for example, an analog switch may be formed on the substrate 1400 while the other part thereof may be mounted with an IC chip.

Alternatively, in the case of forming a TFT using an SAS or a crystalline semiconductor as shown in FIG. 19B, there is a case where the pixel portion 1401, the gate line driver circuits 1403a and 1403b and the like are formed over the substrate 1400 while the source line driver circuit 1402 and the like are mounted as IC chips. In FIG. 19B, the IC chip 1405 is mounted as the source line driver circuit 1402 on the substrate 1400 by COG bonding. Then, the IC chip is connected to an external circuit.

Note that a part of the source line driver circuit 1402, for example an analog switch may be formed on the substrate 1400 while the other part thereof may be mounted with an IC chip.

Further, as shown in FIG. 19C, there is a case where the source line driver circuit 1402 or the like is mounted by TAB instead of COG bonding. Then, the IC chip and an external circuit are connected through the FPC 1406. In FIG. 19C, the source line driver circuit is mounted by TAB; however, the gate line driver circuit may be mounted by TAB.

By mounting an IC chip by TAB, a pixel portion can be provided in a large area relatively to a substrate, thereby downsizing of a frame can be achieved.

An IC chip is formed using a silicon wafer; however, an IC obtained by forming a circuit over a glass substrate (hereinafter referred to as a driver IC) may be provided instead of the IC chip. The IC chip is taken from a circular silicon wafer; therefore, it has a restriction in the shape of a mother substrate. On the other hand, the driver IC is formed of glass as a mother substrate, and thus has no restriction in the shape; therefore, productivity can be increased. Thus, the shape and the size of the driver IC can be set freely. For example, when driver ICs are each formed to have a long side of 15 to 80 mm, a smaller number of driver ICs is required as compared to the case of mounting IC chips. As a result, the number of connecting terminals can be reduced, thereby the yield in manufacture can be improved.

The driver IC can be formed using a crystalline semiconductor formed over a substrate, and is preferably formed by irradiation with continuous wave laser light. A semiconductor film obtained by irradiation with continuous wave laser light has few crystal defects and has crystal grains with large grain size. As a result, a transistor having such a semiconductor film is suitable for a driver IC as it has excellent mobility and response speed, enabling a high-speed drive.

Figure 20A:
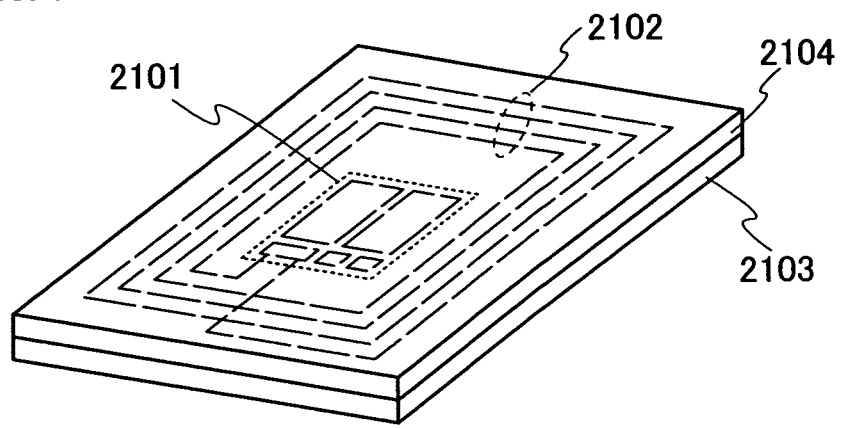
FIGS. 20A and 20B are top views each illustrating an example of a semiconductor device of the invention.

FIG. 20A is a perspective view showing one mode of an ID chip which is one aspect of the invention. Reference numeral 2101 denotes an integrated circuit and 2102 denotes an antenna. The antenna 2102 is connected to the integrated circuit 2101. Reference numeral 2103 denotes a substrate and 2104 denotes a covering material. The integrated circuit 2101 and the antenna 2102 are formed over the substrate 2103, and the covering material 2104 overlaps the substrate 2103 so as to cover the integrated circuit 2101 and the antenna 2102. Note that the covering material 2104 is not necessarily required; however, when the integrated circuit 2101 and the antenna 2102 are covered with the covering material 2104, the mechanical strength of the ID chip can be increased. Alternatively, the integrated circuit may be covered with the antenna. That is, the area occupied by the integrated circuit may be equal to the area occupied by the antenna.

By constructing the integrated circuit 2101 using the semiconductor element shown in the aforementioned embodiment modes or embodiments, an ID chip having few variations can be manufactured with a high yield.

Figure 20B:
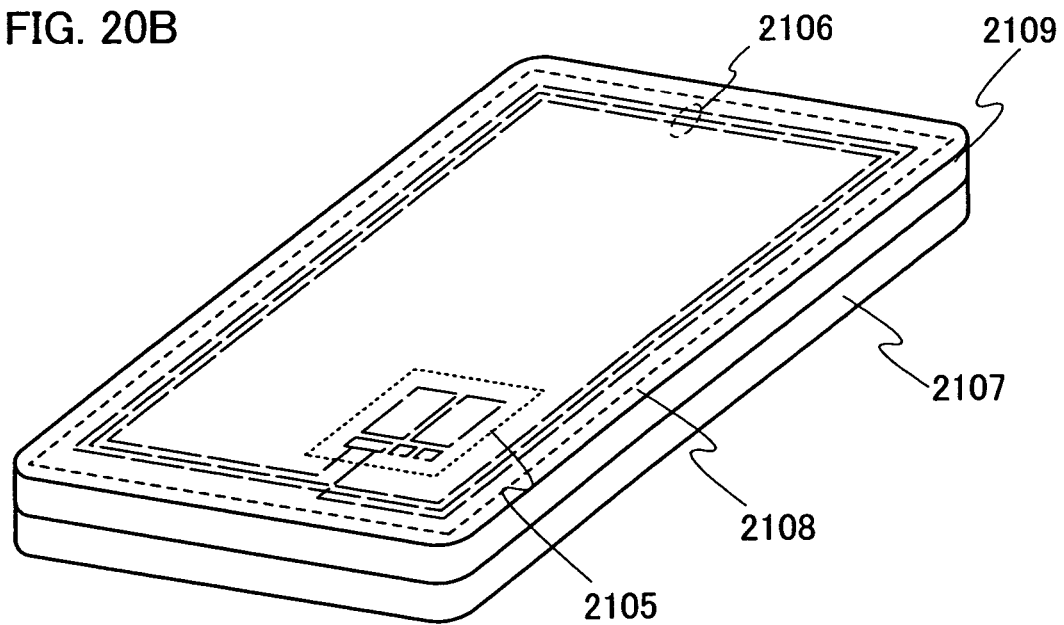

FIG. 20B is a perspective view showing one mode of an IC card which is one aspect of the invention. Reference numeral 2105 denotes an integrated circuit and 2106 denotes an antenna. The antenna 2106 is connected to the integrated circuit 2105. Reference numeral 2108 denotes a substrate functioning as an inlet sheet 2108, and 2107 and 2109 denote covering materials. The integrated circuit 2105 and the antenna 2106 are formed over the inlet sheet 2108, and the inlet sheet 2108 is interposed between the two covering materials 2107 and 2109. Note that the IC card of the invention may have a display device connected to the integrated circuit 2105.

By constructing the integrated circuit 2105 using the semiconductor element shown in the aforementioned embodiment modes or embodiments, an IC card having few variations can be manufactured with a high yield.

Embodiment 9

Figure 21:
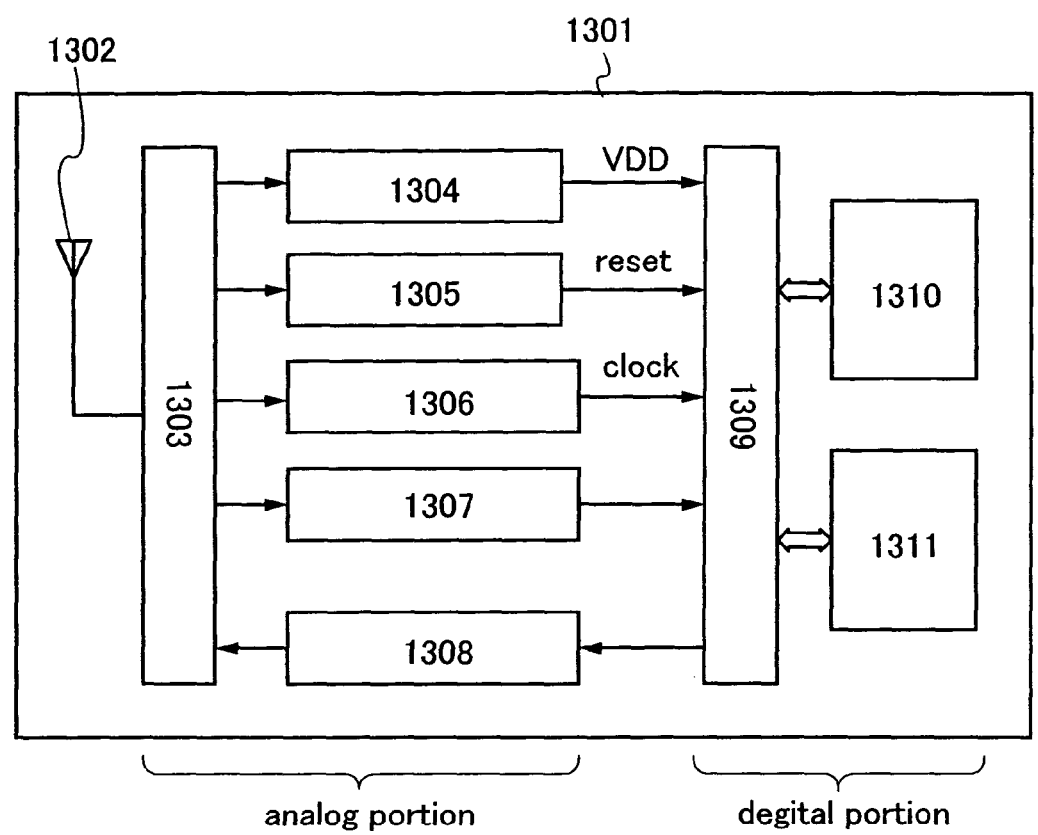
FIG. 21 is a block diagram illustrating an example of a semiconductor device of the invention.

FIG. 21 is a typical block diagram of an ID chip typified by a contactless RFID (Radio Frequency Identification) tag, a wireless tag and the like. FIG. 21 shows a configuration having a simple function to read out fixed data such as authentication data. In FIG. 21, an ID chip 1301 includes an antenna 1302, an RF circuit 1303, a power supply circuit 1304, a reset circuit 1305, a clock generation circuit 1306, a data demodulation circuit 1307, a data modulation circuit 1308, a control circuit 1309, a nonvolatile memory (referred to as NVM) 1310 and an ROM 1311.

In this embodiment, the semiconductor element shown in the aforementioned embodiment modes or embodiments can be used for any of the power supply circuit 1304, the reset circuit 1305, the clock generation circuit 1306, the data demodulation circuit 1307, the data modulation circuit 1308 and the control circuit 1309. Accordingly, an ID chip can be manufactured efficiently.

In addition, the whole circuits shown in FIG. 21 are formed over a glass substrate, a flexible substrate or a semiconductor substrate. The antenna 1302 may be formed either over the glass substrate, the flexible substrate or the semiconductor substrate, or may be formed outside the substrate and connected to the semiconductor integrated circuit inside the substrate.

The RF circuit 1303 receives analog signals from the antenna 1302, and outputs analog signals received from the data modulation circuit 1308 to the antenna 1302. The power supply circuit 1304 generates a constant power supply from received signals, the reset circuit 1305 generates reset signals, the clock generation circuit 1306 generates clock signals, the data demodulation circuit 1307 extracts data from received signals, and the data modulation circuit 1308 generates analog signals to be outputted to the antenna based on the received digital signals, or changes the characteristics of the antenna. Such circuits constitute the analog portion.

Meanwhile, the control circuit 1309 receives data extracted from the received signals, and reads out the data. Specifically, the control circuit 1309 generates address signals of the NVM 1310 and the ROM 1311, reads out data, and transmits the readout data to the data modulation circuit 1308. Such circuits constitute the digital portion.

Embodiment 10

As an electronic appliance having the semiconductor device shown in embodiment modes and embodiments, there are a television set (also simply referred to as a television or a television receiver set), a digital camera, a digital video camera, a portable phone set (also simply referred to as a portable phone), a portable information terminal such as a PDA, a portable game machine, a computer monitor, a computer, an audio reproducing system such as a car audio system, an image reproducing system provided with a recording medium such as a home game machine, and the like. Specific examples of such electronic appliances are described with reference to FIGS. 23A to 23F.

Figure 23A:
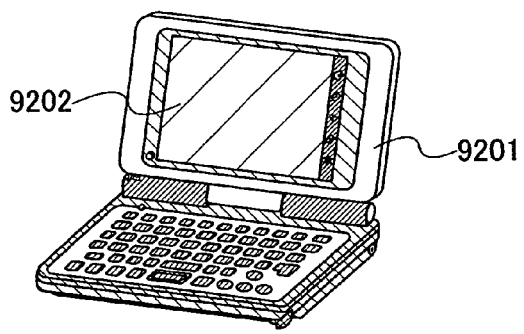
FIGS. 23A to 23F are views illustrating examples of an electronic appliance.

A portable information terminal shown in FIG. 23A includes a main body 9201, a display portion 9202 and the like. The display portion 9202 can be formed by adopting the semiconductor device shown in Embodiment Modes 1 to 7 or Embodiments 1 to 8. By using the display device as one aspect of the invention, a portable information terminal capable of displaying high-quality images can be provided at low cost.

Figure 23B:
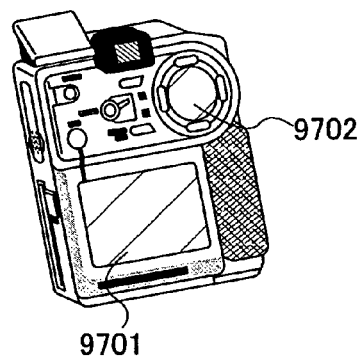

A digital video camera shown in FIG. 23B includes a display portion 9701, a sub-display 9702 and the like. The display portion 9701 can be formed by adopting the semiconductor device shown in Embodiment Modes 1 to 7 or Embodiments 1 to 8. By using the display device as one aspect of the invention, a digital video camera capable of displaying high-quality images can be provided at low cost.

Figure 23C:
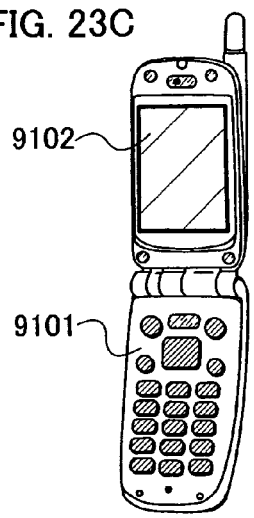

A portable terminal shown in FIG. 23C includes a main body 9101, a display portion 9102 and the like. The display portion 9102 can be formed by adopting the semiconductor device shown in Embodiment Modes 1 to 7 or Embodiments 1 to 8. By using the display device as one aspect of the invention, a portable terminal capable of displaying high-quality images can be provided at low cost.

Figure 23D:
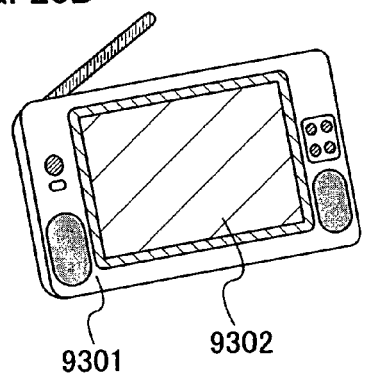

A portable television set shown in FIG. 23D includes a main body 9301, a display portion 9302 and the like. The display portion 9302 can be formed by adopting the semiconductor device shown in Embodiment Modes 1 to 7 or Embodiments 1 to 8. By using the display device as one aspect of the invention, a portable television set capable of displaying high-quality images can be provided at low cost. Such a television set has a wide range of applications including a compact-size television set mounted on a portable terminal such as a portable phone, a medium-size portable television set and a large-size television set (e.g., 40 inches or larger).

Figure 23E:
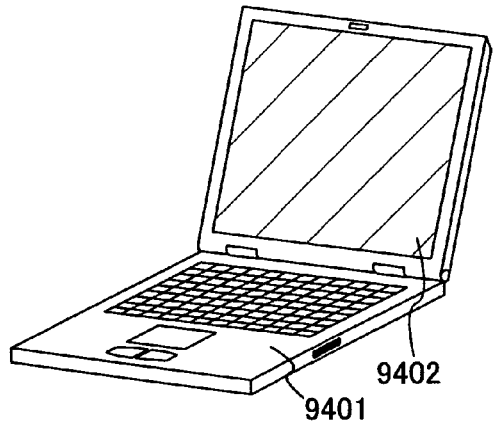

A portable computer shown in FIG. 23E includes a main body 9401, a display portion 9402 and the like. The display portion 9402 can be formed by adopting the semiconductor device shown in Embodiment Modes 1 to 7 or Embodiments 1 to 8. By using the display device as one aspect of the invention, a portable computer capable of displaying high-quality images can be provided at low cost.

Figure 23F:
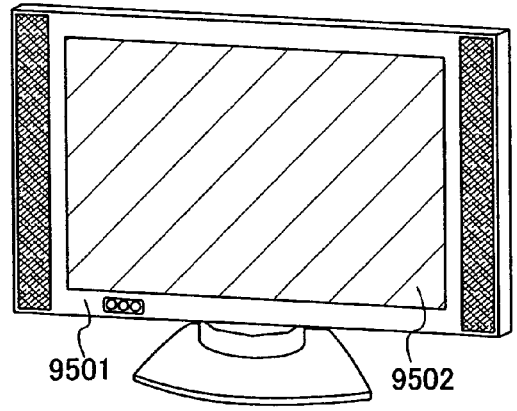

A television set shown in FIG. 23F includes a main body 9501, a display portion 9502 and the like. The display portion 9502 can be formed by adopting the semiconductor device shown in Embodiment Modes 1 to 7 or Embodiments 1 to 8. By using the display device as one aspect of the invention, a television set capable of displaying high-quality images can be provided at low cost.

Among the aforementioned electronic appliances, those using a secondary battery can operate for a longer period as the power consumption is reduced, and the secondary battery is not required to be charged.

Embodiment 11

Figure 24:
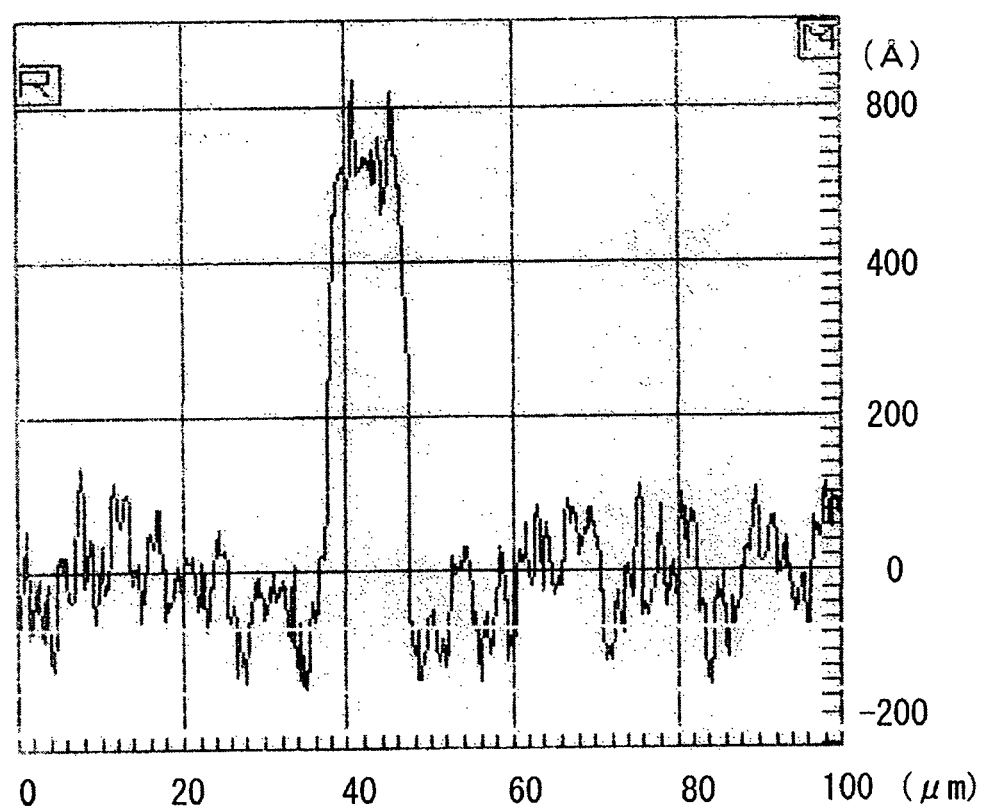
FIG. 24 is a graph illustrating a cross section of a semiconductor layer which is formed in accordance with the invention.

In this embodiment, description is made with reference to FIG. 24 on a cross section of a semiconductor layer which is formed by using Embodiment Mode 2.

Over a glass substrate, an amorphous silicon film is formed with a thickness of 54 nm by CVD. Then, an oxide film formed over the surface of the amorphous silicon film is removed using a hydrofluoric acid solution.

Next, the amorphous silicon film is partially irradiated with a laser beam (wavelength: 532 nm, beam diameter: 15 to 20 μm) emitted from a $YVO_4$ laser. Then, a silicon oxide film is formed in the region irradiated with the laser beam.

Next, the amorphous silicon film is etched using tetramethylammonium hydroxide. At this time, the amorphous silicon film is exposed to the tetramethylammonium hydroxide at 50 to 60° C. for 150 to 200 seconds. As a result, the amorphous silicon film of a region not covered with the silicon oxide film is removed.

After that, the silicon oxide film is removed. FIG. 24 shows the result obtained by measuring the shape of steps in the amorphous silicon film of the region which is partially etched, using a stylus profilometer: DEKTAK$^3$ST (product of Japan Vacuum Technology Co., Ltd.).

The horizontal axis of FIG. 24 shows a width of a measured region while the vertical axis thereof shows projections/depressions of the substrate surface. In the region having a width of about 10 μm (horizontal axis of 35 to 46 μm), a projection with a thickness of 500 to 530 nm was formed. By measuring the region with an optical microscope, it was found that the projection corresponds to the amorphous silicon film of the region which is partially etched.

According to the measurement result, it is possible to form a silicon oxide film by irradiating an amorphous silicon film with a laser beam, and the amorphous silicon film can be etched using the silicon oxide film as a mask.

The present application is based on Japanese Priority application No. 2004-252497 filed on Aug. 31, 2004 with the Japanese Patent Office, the entire contents of which are hereby incorporated by reference.

What is claimed is:

1. A method for forming a semiconductor device comprising:

forming a semiconductor film over a substrate;

performing a dehydrogenation treatment by heating the semiconductor film;

forming an oxide layer over the semiconductor film by irradiating a predetermined area of the semiconductor film with a laser beam passed through an optical system comprising a lens to have a beam spot width of 20 μm or less without using a mask after the performing the dehydrogenation treatment;

removing a natural oxide film on the semiconductor film by etching so that the oxide layer remains on the semiconductor film; and patterning the semiconductor film by etching using the oxide layer as a mask.

2. The method for forming a semiconductor device according to claim 1, wherein the semiconductor film comprises amorphous silicon.

3. The method for forming a semiconductor device according to claim 1, wherein the semiconductor film comprises crystalline silicon.

4. The method for forming a semiconductor device according to claim 1, wherein the semiconductor film is etched by wet etching.

5. The method for forming a semiconductor device according to claim 1, wherein the semiconductor film is etched by dry etching.

6. The method for forming a semiconductor device according to claim 1, wherein the laser beam is emitted from a laser beam direct writing system.

7. The method for forming a semiconductor device according to claim 1, wherein the laser beam is emitted from an excimer laser oscillator of KrF, ArF, XeCl, or Xe.

8. The method for forming a semiconductor device according to claim 1, wherein the laser beam is emitted from a gas laser oscillator of He, He—Cd, Ar, He—Ne, or HF.

9. The method for forming a semiconductor device according to claim 1, wherein the laser beam is emitted from a solid laser oscillator using crystals of YAG, $YVO_4$, YLF, or $YAlO_3$ which are doped with Cr, Nd, Er, Ho, Ce, Co, Ti, or Tm.

10. The method for forming a semiconductor device according to claim 1, wherein the laser beam is emitted from a semiconductor laser oscillator of GaN, GaAs, GaAlAs, or InGaAsP.

11. The method for forming a semiconductor device according to claim 1, wherein the laser beam is a continuous wave laser beam.

12. The method for forming a semiconductor device according to claim 1, wherein the laser beam is a pulsed laser beam.

13. The method for forming a semiconductor device according to claim 1, wherein the patterned semiconductor film is included in a semiconductor element selected from the group consisting of a thin film transistor, a memory element, a diode, a photoelectric conversion element, a capacitor, and a resistor.

14. The method for forming a semiconductor device according to claim 1, wherein the oxide layer is formed by directly irradiating the semiconductor film with the laser beam in accordance with movement data produced by a personal computer.

15. The method for forming a semiconductor device according to claim 1, wherein laser irradiation is performed by scanning the laser beam in X and Y directions.

16. The method for forming a semiconductor device according to claim 1, wherein laser irradiation is performed by moving the substrate in X and Y directions.

17. The method for forming a semiconductor device according to claim 1, wherein laser irradiation is performed by scanning the laser beam in one direction of X and Y directions, and moving the substrate in the other direction.

18. The method for forming a semiconductor device according to claim 1, wherein the optical system further comprises an acousto-optic deflector.

19. A method for forming a semiconductor device comprising:
  forming a semiconductor film over a substrate;
  performing a dehydrogenation treatment by heating the semiconductor film;
  irradiating a predetermined area of the semiconductor film through a first oxide layer on the semiconductor film with a laser beam passed through an optical system comprising a lens to have a beam spot width of 20 μm or less without using a mask to form a second oxide layer on the semiconductor film after the performing the dehydrogenation treatment;
  removing the first oxide layer on the semiconductor film by etching so that the second oxide layer remains on the semiconductor film; and
  patterning the semiconductor film by etching using the second oxide layer as a mask.

20. The method for forming a semiconductor device according to claim 19, wherein the semiconductor film comprises amorphous silicon.

21. The method for forming a semiconductor device according to claim 19, wherein the semiconductor film comprises crystalline silicon.

22. The method for forming a semiconductor device according to claim 19, wherein the semiconductor film is etched by wet etching.

23. The method for forming a semiconductor device according to claim 19, wherein the semiconductor film is etched by dry etching.

24. The method for forming a semiconductor device according to claim 19, wherein the laser beam is emitted from a laser beam direct writing system.

25. The method for forming a semiconductor device according to claim 19, wherein the laser beam is emitted from an excimer laser oscillator of KrF, ArF, XeCl, or Xe.

26. The method for forming a semiconductor device according to claim 19, wherein the laser beam is emitted from a gas laser oscillator of He, He—Cd, Ar, He—Ne, or HF.

27. The method for forming a semiconductor device according to claim 19, wherein the laser beam is emitted from a solid laser oscillator using crystals of YAG, $YVO_4$, YLF, or $YAlO_3$ which are doped with Cr, Nd, Er, Ho, Ce, Co, Ti, or Tm.

28. The method for forming a semiconductor device according to claim 19, wherein the laser beam is emitted from a semiconductor laser oscillator of GaN, GaAs, GaAlAs, or InGaAsP.

29. The method for forming a semiconductor device according to claim 19, wherein the laser beam is a continuous wave laser beam.

30. The method for forming a semiconductor device according to claim 19, wherein the laser beam is a pulsed laser beam.

31. The method for forming a semiconductor device according to claim 19, wherein the patterned semiconductor film is included in a semiconductor element selected from the group consisting of a thin film transistor, a memory element, a diode, a photoelectric conversion element, a capacitor, and a resistor.

32. The method for forming a semiconductor device according to claim 19, wherein the second oxide layer is formed by directly irradiating the semiconductor film with the laser beam in accordance with movement data produced by a personal computer.

33. The method for forming a semiconductor device according to claim 19, wherein laser irradiation is performed by scanning the laser beam in X and Y directions.

34. The method for forming a semiconductor device according to claim 19, wherein laser irradiation is performed by moving the substrate in X and Y directions.

35. The method for forming a semiconductor device according to claim 19, wherein laser irradiation is performed by scanning the laser beam in one direction of X and Y directions, and moving the substrate in the other direction.

36. The method for forming a semiconductor device according to claim 19, wherein the optical system further comprises an acousto-optic deflector.

* * * * *